(12) United States Patent  
Suzuki et al.

(10) Patent No.: US 7,834,414 B2  
(45) Date of Patent: Nov. 16, 2010

(54) SEMICONDUCTOR DEVICE WITH TENSILE STRAIN AND COMPRESSIVE STRAIN

(75) Inventors: Takashi Suzuki, Kawasaki (JP); Kiyoshi Ozawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 67 days.

(21) Appl. No.: 12/132,965

(22) Filed: Jun. 4, 2008

(65) Prior Publication Data

US 2008/0237725 A1    Oct. 2, 2008

Related U.S. Application Data

(63) Continuation of application No. PCT/JP2005/023250, filed on Dec. 19, 2005.

(51) Int. Cl.  
*H01L 29/00*   (2006.01)

(52) U.S. Cl. .................................. 257/506

(58) Field of Classification Search ............... None  
See application file for complete search history.

(56) References Cited

U.S. PATENT DOCUMENTS

| 5,317,175 | A  |   | 5/1994 | Throngnumchai |         |
|-----------|----|---|--------|---------------|---------|
| 6,943,391 | B2 | * | 9/2005 | Chi et al.    | 257/254 |
| 7,081,395 | B2 | * | 7/2006 | Chi et al.    | 438/424 |

| 2005/0121727 | A1 | 6/2005  | Ishitsuka et al.  |
|--------------|----|---------|-------------------|
| 2005/0245081 | A1 | 11/2005 | Chakravarti et al.|

FOREIGN PATENT DOCUMENTS

| CN | 1592969      | A | 3/2005  |
|----|--------------|---|---------|
| JP | 4-256356     | A | 9/1992  |
| JP | 2003-158241  | A | 5/2003  |
| JP | 2004-63591   | A | 2/2004  |
| JP | 2004-235332  | A | 8/2004  |
| JP | 2004-281964  | A | 10/2004 |
| JP | 2005-317980  | A | 11/2005 |

OTHER PUBLICATIONS

International Search Report of PCT/JP2005/023250, date of mailing Mar. 14, 2006.  
Chinese Office Action dated Sep. 11, 2009, issued in corresponding Chinese Patent Application No. 200500523499.  
Korean Office Action dated Feb. 1, 2010, issued in corresponding Korean Patent Application No. 10-2008-7014356.

* cited by examiner

*Primary Examiner*—Scott B Geyer  
(74) *Attorney, Agent, or Firm*—Westerman, Hattori, Daniels & Adrian, LLP

(57) ABSTRACT

A semiconductor device according to the present invention includes an active region having a MOS transistor and a groove surrounding the periphery of the active region, in which the groove is filled with a combination of a first material that produces a tensile strain in the active region and a second material that produces a compressive strain. Thereby, the foregoing object is achieved.

10 Claims, 21 Drawing Sheets

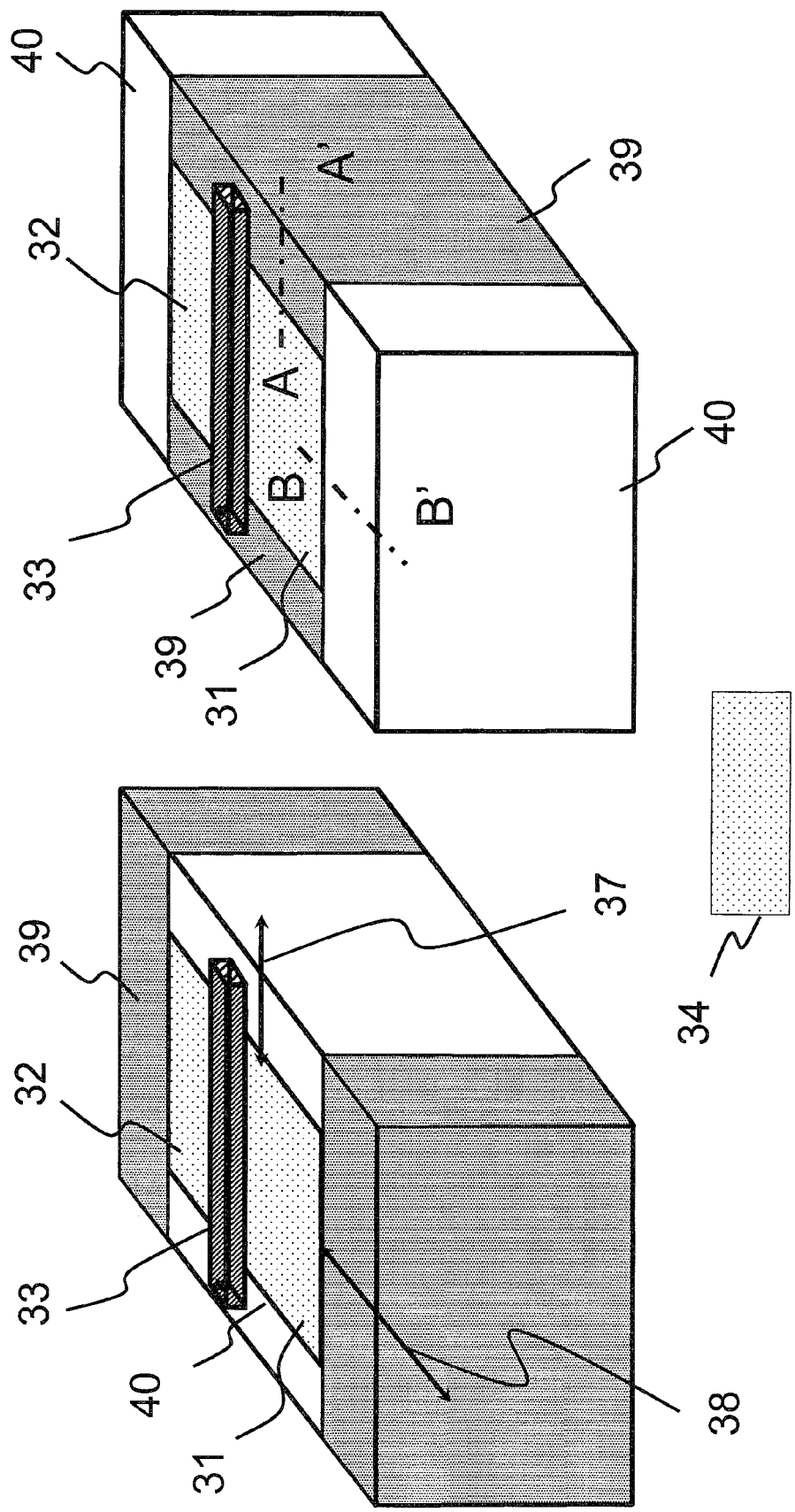

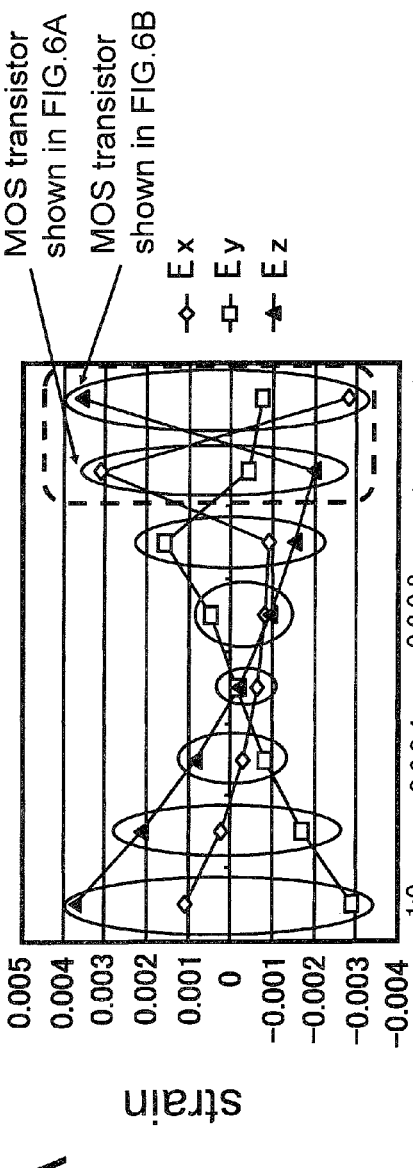
FIG.7A
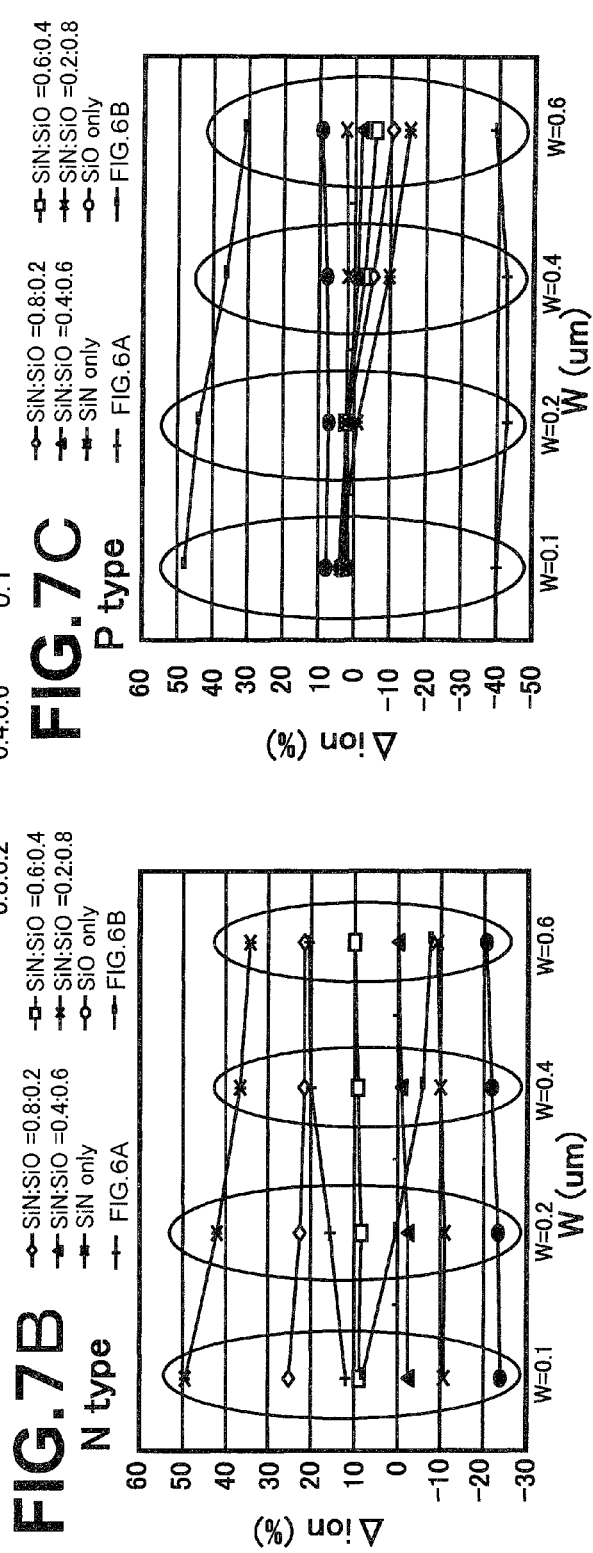
FIG.7B N type
FIG.7C P type

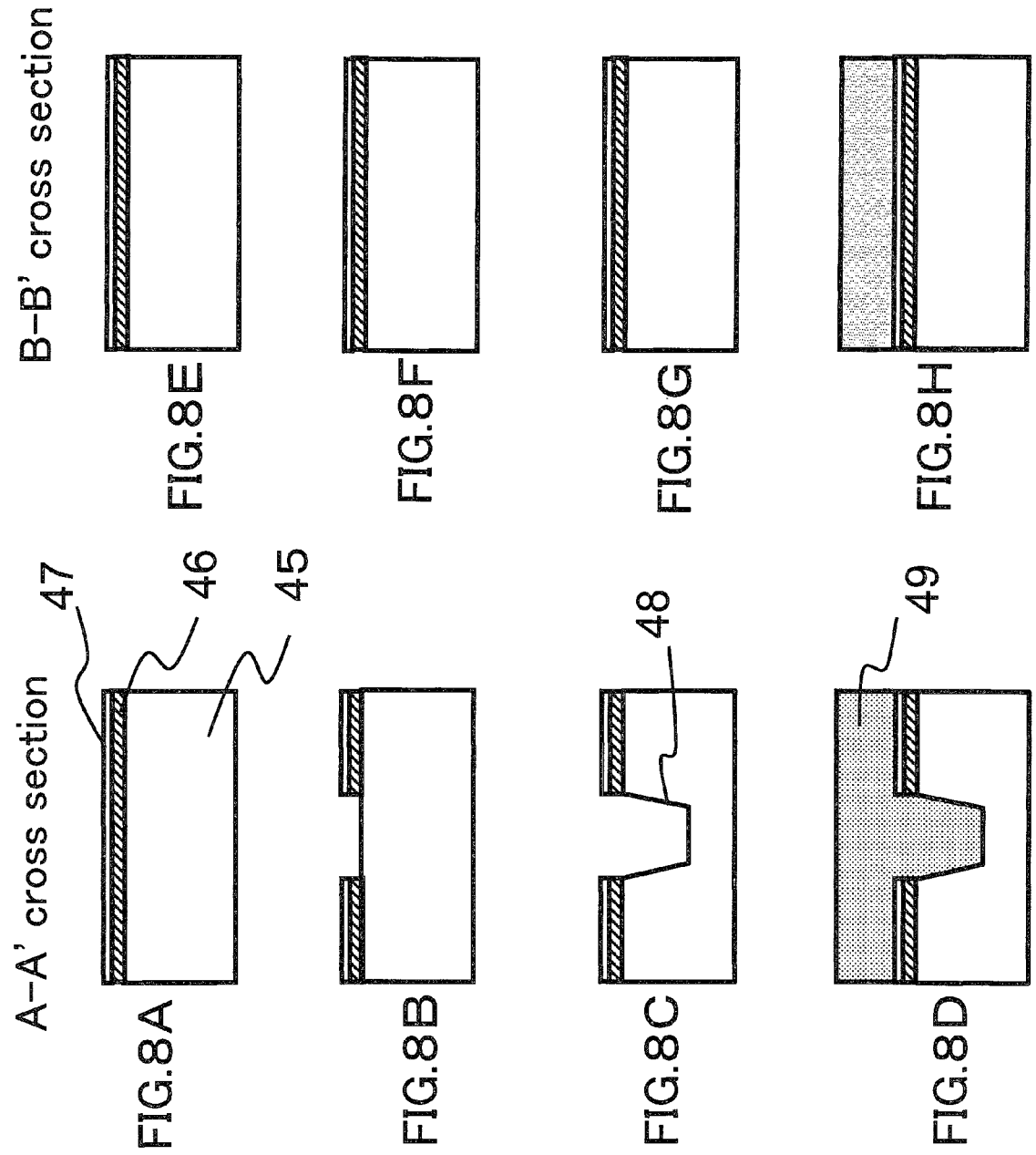

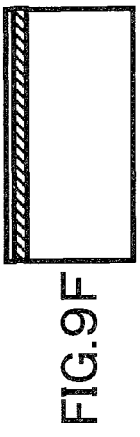
FIG.9A
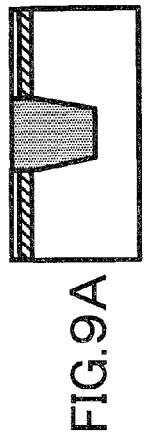
FIG.9B
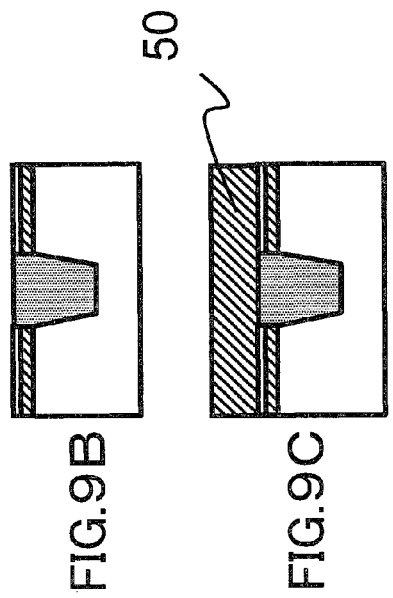
FIG.9C
FIG.9D
FIG.9E
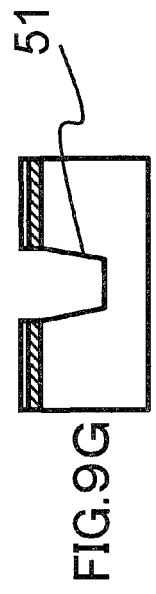
FIG.9F
FIG.9G
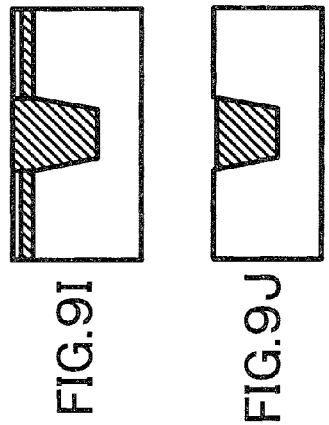
FIG.9H
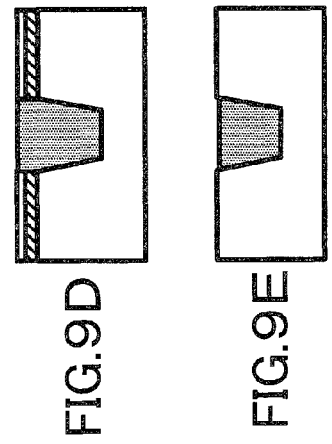
FIG.9I
FIG.9J

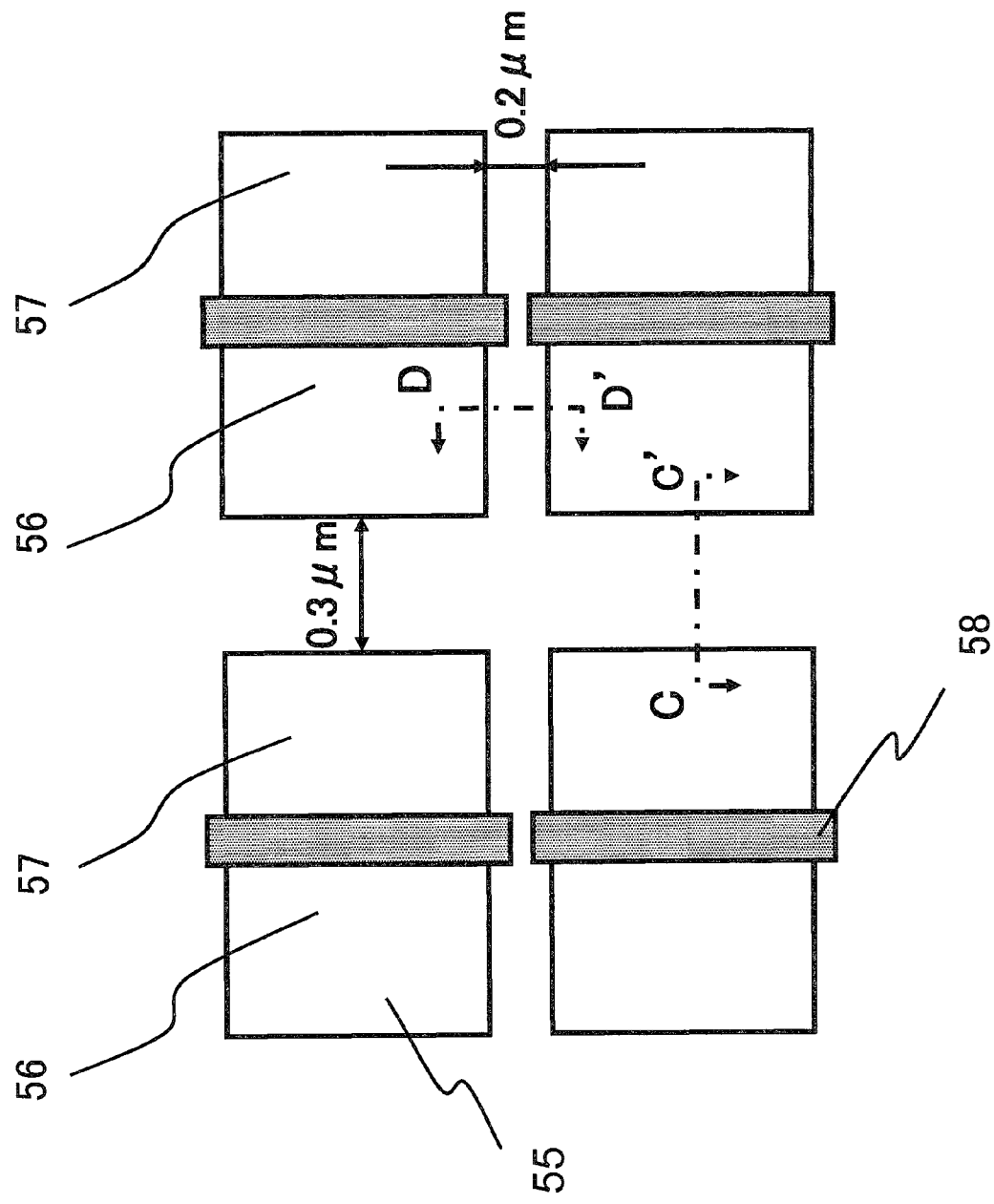

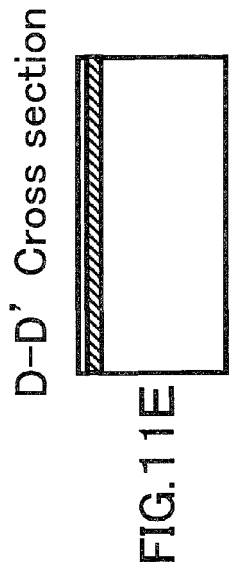
FIG.11A
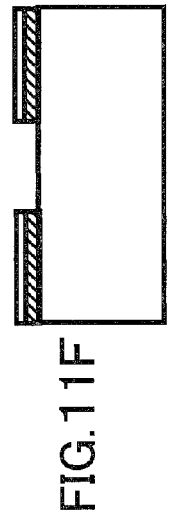
FIG.11B
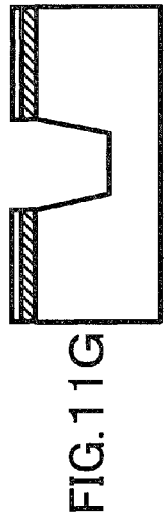
FIG.11C
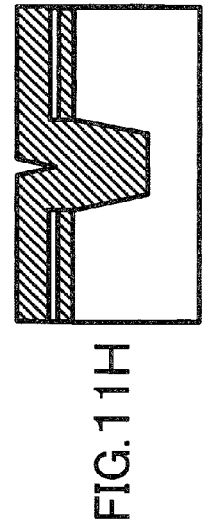
FIG.11D
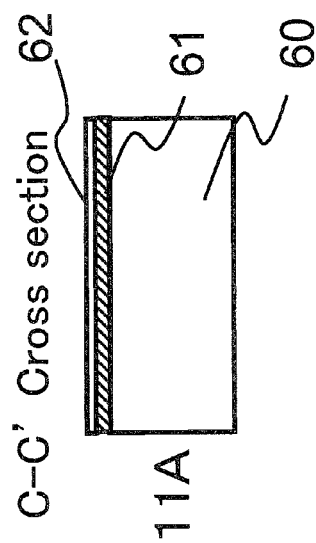
FIG.11E
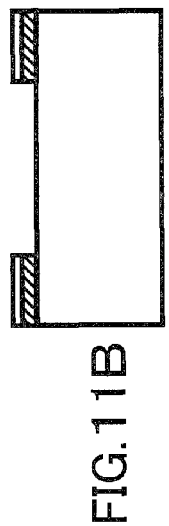
FIG.11F
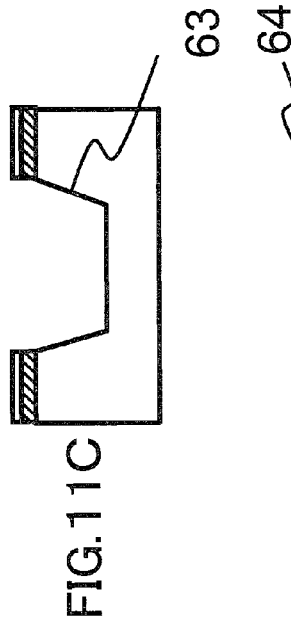
FIG.11G
FIG.11H C-C' Cross section
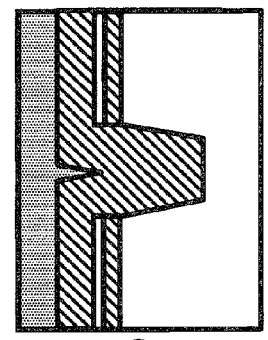
FIG.12A
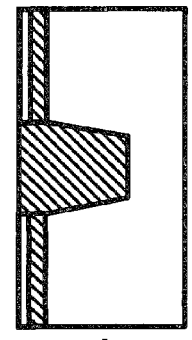
FIG.12B
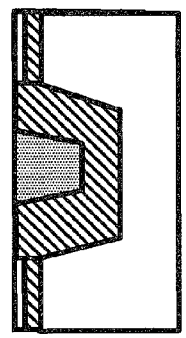
FIG.12C
D-D' Cross section
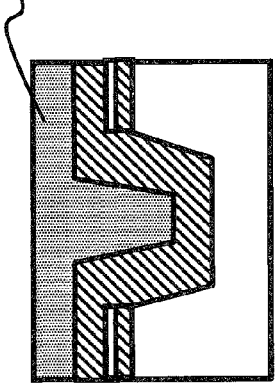
FIG.12D
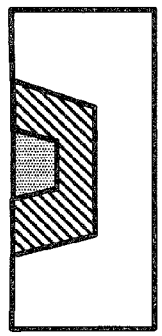
FIG.12E
FIG.12F
65

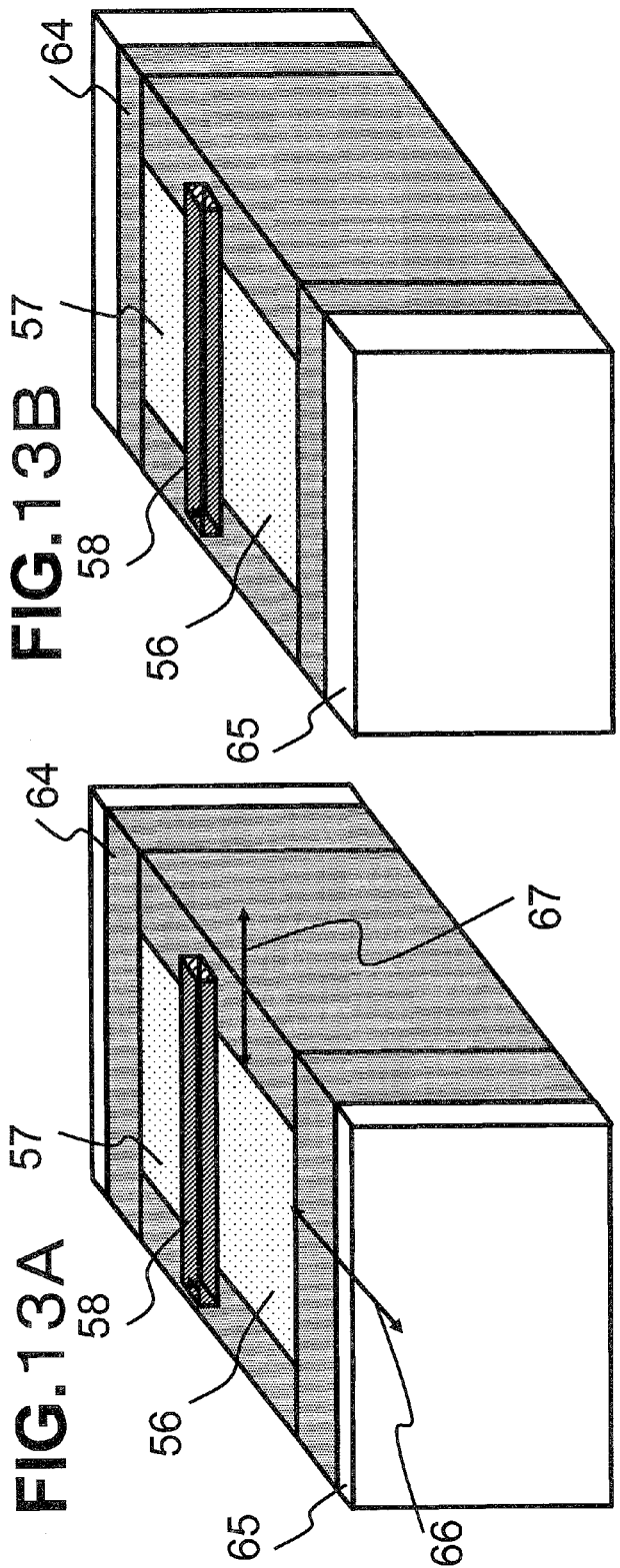
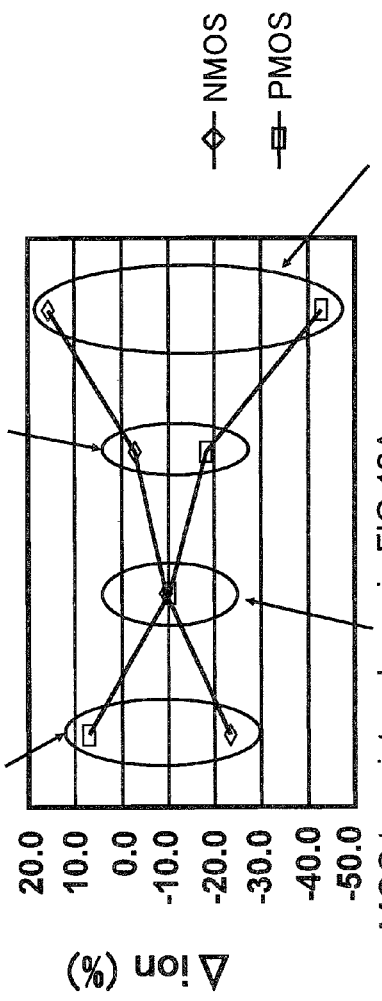

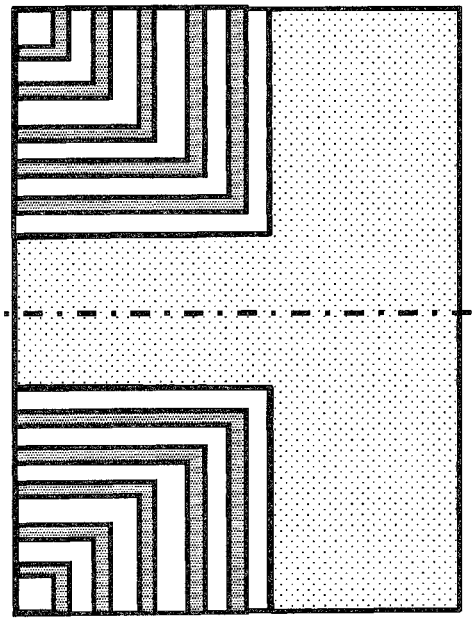
FIG.14C
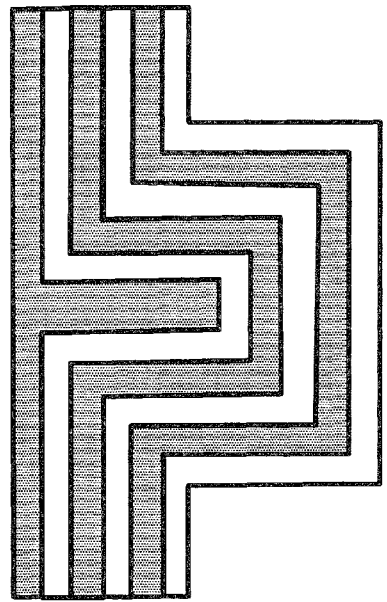
FIG.14D
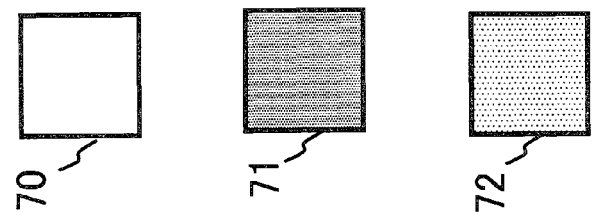
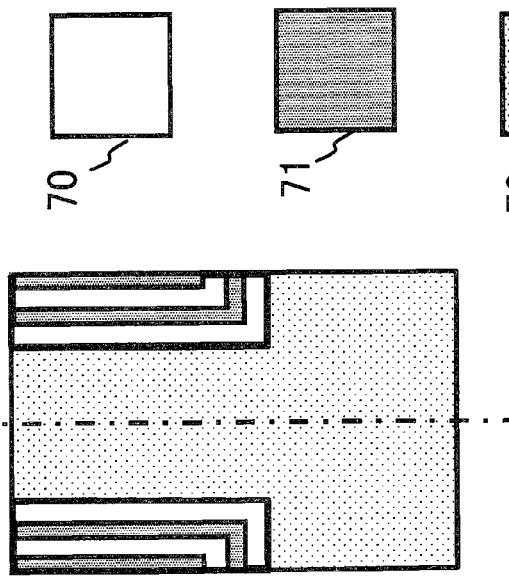
FIG.14A
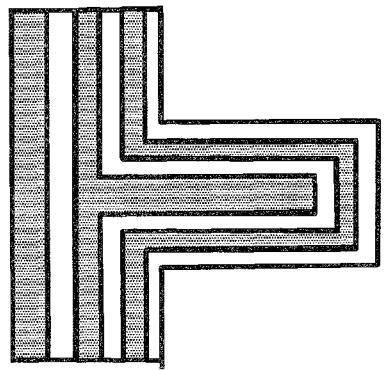
FIG.14B

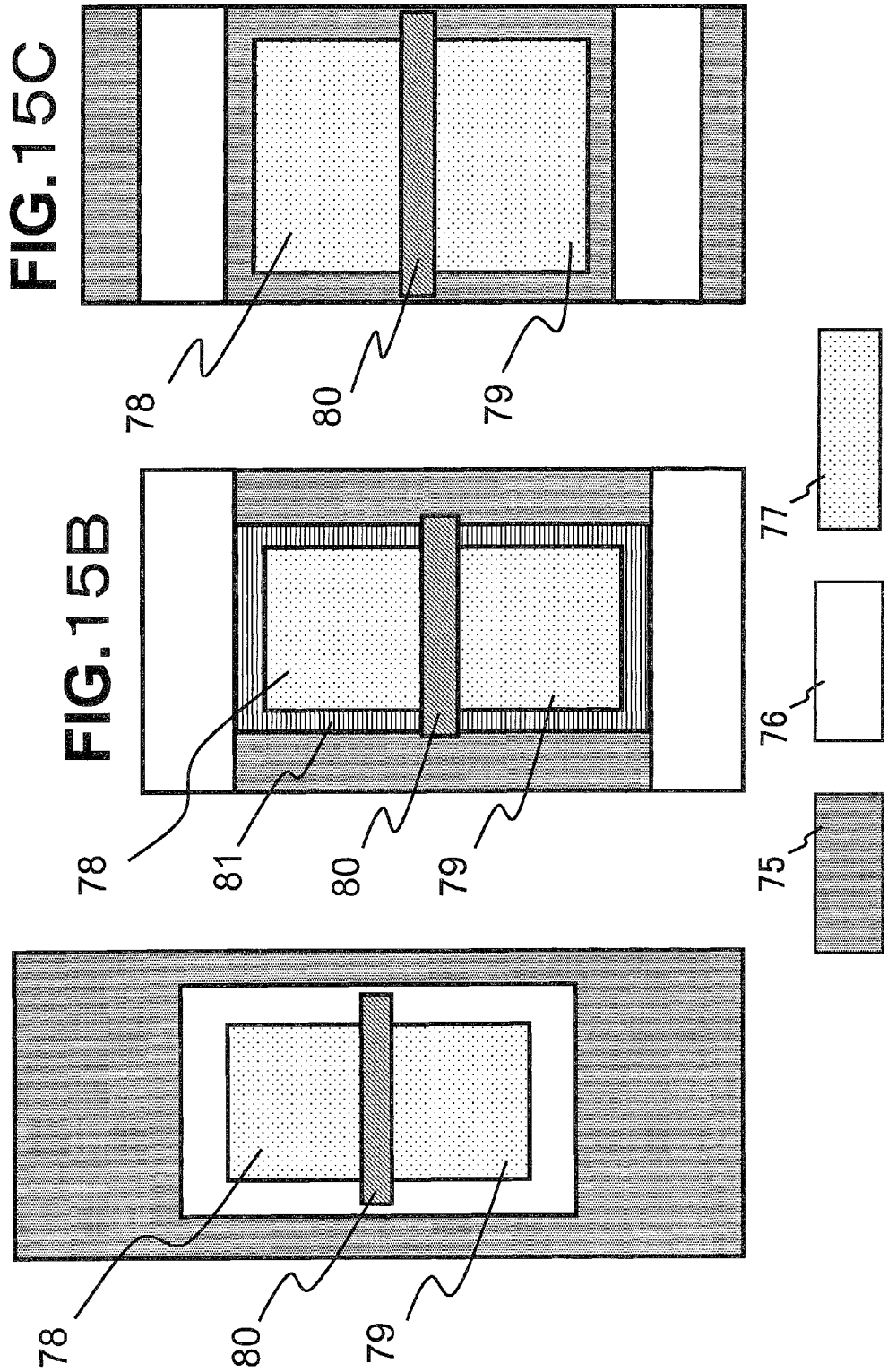

SEMICONDUCTOR DEVICE WITH TENSILE STRAIN AND COMPRESSIVE STRAIN

TECHNICAL FIELD

This is related to a semiconductor device and a method for manufacturing the semiconductor device. In particular, this is related to a semiconductor device including a plurality of materials that produce strain directly under a gate in order to control electrical properties of a MOS transistor, and relates to a method for manufacturing the semiconductor device.

BACKGROUND

Miniaturization of semiconductor elements has resulted in continued improvement in the performance of MOS transistors for a long time. In recent years, expected improvement in the performance of MOS transistors has not been obtained despite continued miniaturization of semiconductor elements.

One of the causes is a reduction in the carrier mobility of a MOS transistor due to the introduction of impurities to a portion directly under a gate in order to control thresholds of the miniaturized MOS transistor. Furthermore, an increase in electric field intensity with a thinner gate insulating film results in more carriers colliding with the gate insulating film. This results in an increase in the number of carriers scattered by irregularities of the gate insulating film, thereby reducing carrier mobility.

It has been reported that to improve carrier mobility in a MOS transistor, the crystal lattice of a substrate is strained in a channel region directly under a gate with a material such as silicon oxide producing strain (for example, Japanese Laid-open Patent Publication No. 2004-235332).

The direction of strain for improving carrier mobility differs between an N-type MOS transistor utilizing electrons as carriers and a P-type MOS transistor utilizing holes as carriers. Thus, when the mobility of one type of carriers is increased by the same type of strain acting on the active regions, the mobility of the other type of carriers is reduced.

It has been reported that a semiconductor device has a structure such that the mobility of one type of carriers for an N-type MOS transistor and a P-type MOS transistor is increased and such that a reduction in the mobility of the other is prevented.

According to the above-described document, the semiconductor device has an active region including the N-type MOS transistor, and an active region including the P-type MOS transistor, and grooves for isolating these active regions. With respect to the groove surrounding the N-type MOS transistor, sections of the groove parallel and perpendicular to the direction in which a source subregion and a drain subregion are connected are filled with an oxidation preventive film (e.g., silicon nitride) and a material composed of a silicon oxide film producing strain. With respect to the groove surrounding the P-type MOS transistor, sections of the groove parallel to the direction in which a source subregion and a drain subregion are connected are filled with an oxidation preventive film and a material composed of silicon oxide producing strain. Sections of the groove perpendicular to the direction in which the source subregion and the drain subregion are connected are filled with silicon oxide alone. No stress is applied to the active region of the N-type MOS transistor because silicon oxide does not grow in the subsequent oxidation treatment. On the other hand, a compressive stress is applied to the active region of the P-type MOS transistor because silicon oxide grows in the sections of the groove perpendicular to the direction in which the source subregion and the drain subregion are connected. Thereby, a reduction in electron mobility is prevented, and the hole mobility is improved (for example, Japanese Laid-open Patent Publication No. 2003-158241).

In the arrangement of the material producing strain described in Patent Document 2, the strain produced in the active region of the MOS transistor is determined only by the property of one type of material producing strain. Thus, it is difficult to adjusting the strain produced in the active region to a target state.

In the case where unevenness in the amount of change in electrical properties occurs even when a constant strain is produced in the active region of the MOS transistor, disadvantageously, the unevenness in the electrical properties of the MOS transistor cannot be prevented.

Disadvantageously, the strain produced in the active region of the MOS transistor cannot be controlled so as to be larger than the strain determined only by the property of one type of material producing strain.

SUMMARY OF THE INVENTION

According to one aspect of the embodiments, a semiconductor device includes a semiconductor substrate, an active region arranged in the semiconductor substrate, and a groove surrounding the periphery of the active region. The groove of the semiconductor device is filled with a combination of a first material that produces a tensile strain in the active region and a second material that produces a compressive strain in the active region.

BRIEF DESCRIPTION OF DRAWINGS

FIG. 1A is a plan view, and FIG. 1B is a cross-sectional view.

FIGS. 6A and 6B are perspective views illustrating active regions including MOS transistors and STI regions filled with stressor materials of a semiconductor device according to a second embodiment.

FIGS. 7A to 7C are graphs showing changes in the state of strain in the active regions and changes in the properties of the MOS transistors shown in FIGS. 6A and 6B.

FIGS. 8A to 8H are cross-sectional views taken along line A-A' and line B-B' in FIG. 6B and illustrate steps of filling an STI region with a stressor such as SiN in a method for manufacturing a semiconductor device according to a third embodiment.

FIGS. 9A to 9J are cross-sectional views taken along lines A-A' and B-B' in FIG. 6B and illustrate steps of filling an STI region with a stressor such as SiN.

FIG. 10 shows a 2 by 2 array of a matrix of a plurality of MOS transistors spaced at fixed intervals in a semiconductor device according to a fourth embodiment.

FIGS. 11A to 11H are cross-sectional views of the MOS transistors taken along chain lines C-C' and D-D' in FIG. 10 and illustrate a method for manufacturing the matrix of the MOS transistors shown in FIG. 10.

FIGS. 12A to 12F are cross-sectional views of the MOS transistors taken along chain lines C-C' and D-D' in FIG. 10 and illustrate a method for manufacturing the matrix of the MOS transistors shown in FIG. 10.

FIGS. 13A and 13B show examples of the arrangement of a SiN layer 65 and a SiO₂ layer 64 in an STI region that can be formed by the method for manufacturing the semiconductor device shown in FIGS. 11A to 11H and 12A to 12F, and FIG. 13C is a graph showing changes in the properties of the MOS transistors isolated by the STI region described above.

FIGS. 14A to 14D are cross-sectional views of STI regions and active regions of MOS transistors in a semiconductor device according to a fifth embodiment.

FIGS. 15A to 15C show active regions and STI regions that isolate the active regions of the MOS transistors in a semiconductor device according to a sixth embodiment.

DESCRIPTION OF THE PREFERRED EMBODIMENT

A first embodiment, a second embodiment, a third embodiment, a fourth embodiment, a fifth embodiment, a sixth embodiment, a seventh embodiment, an eighth embodiment, and a ninth embodiment will be described below.

First Embodiment

A first embodiment relates to a semiconductor device including an STI region formed of a groove which is filled with a material producing strain (hereinafter, referred to as a "stressor" in the first embodiment), isolates an active region including an N-type MOS transistor or a P-type MOS transistor, and surrounds the active region. The first embodiment also relates to a method for manufacturing the semiconductor device. The first embodiment will be described with reference to FIGS. 1A, 1B, 2A to 2C, 3A to 3D, 4, and 5A to 5G.

Figure 1B:
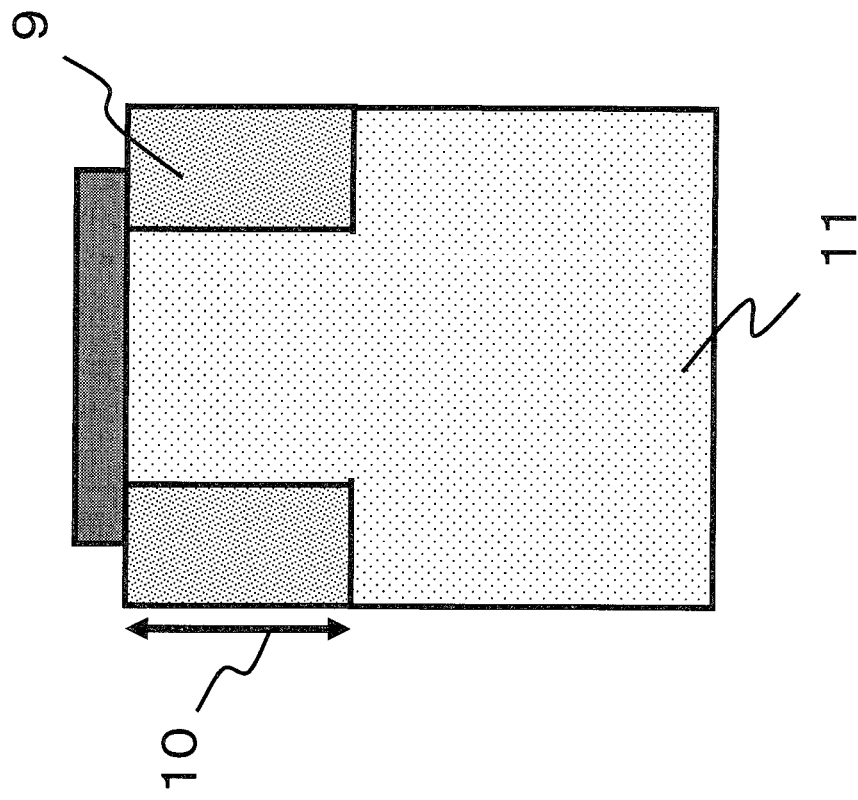
FIGS. 1A and 1B schematically show the structure of a typical MOS transistor.
Figure 1A:
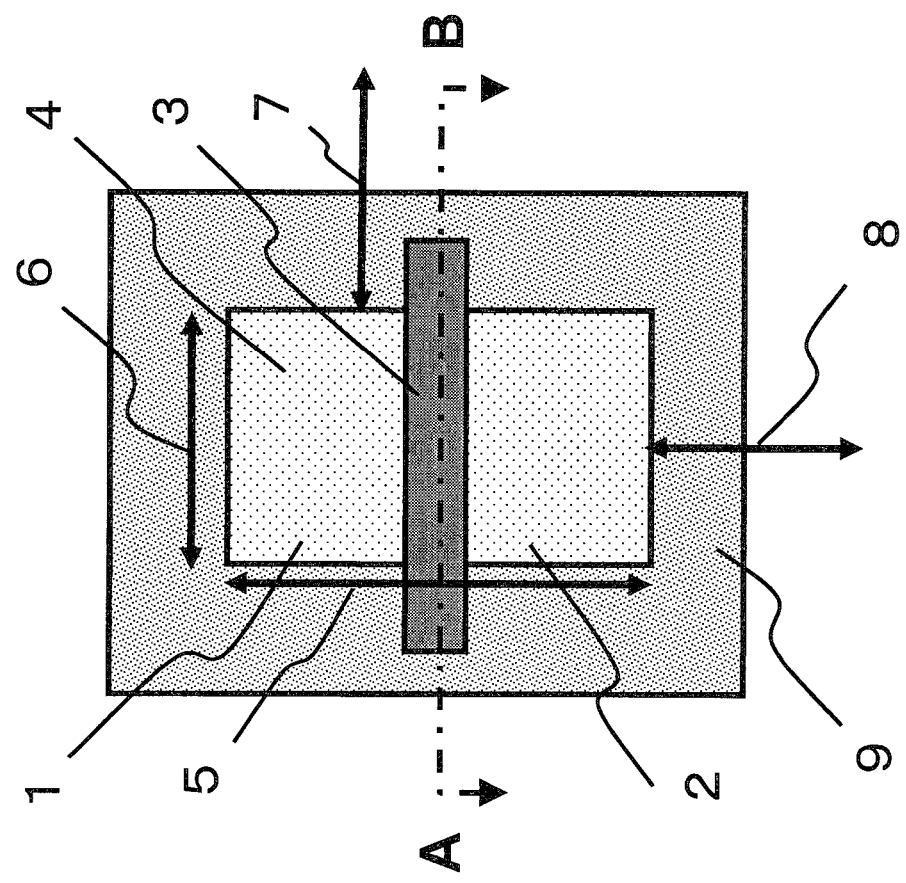

FIGS. 1A and 1B schematically show structures of a typical MOS transistor. FIG. 1A is a plan view. FIG. 1B is a cross-sectional view. FIGS. 1A and 1B show a source subregion 1 of a MOS transistor, a drain subregion 2 of the MOS transistor, a gate electrode 3 of the MOS transistor, an active region 4 of the MOS transistor, an arrow 5 indicating the width of the active region 4 of the MOS transistor in the direction of the source-drain, an arrow 6 indicating the width of the active region 4 of the MOS transistor, the width corresponding to the channel width of the MOS transistor, an arrow 7 indicating the distance between adjacent regions in a transverse direction, an arrow 8 indicating the distance between adjacent regions in a longitudinal direction, high density plasma (HDP)-SiO₂ (silicon oxide) 9, an arrow 10 indicating the height of the active region 4 of the MOS transistor, and a silicon substrate 11.

FIG. 1A is a plan view of a shallow trench isolation (STI) region surrounding a MOS transistor and the active region 4 of the MOS transistor. The MOS transistor includes the active region 4 and the gate electrode 3. The active region 4 includes the source subregion 1 and the drain subregion 2 separated by the gate electrode 3.

In the active region 4 of the MOS transistor, the width in the direction indicated by the arrow 5 is 400 nm. The width in the direction indicated by the arrow 6 is defined as W. The value of W is about 200 nm. Like the silicon substrate 11, the active region 4 of the MOS transistor is composed of crystalline silicon. The interval between the active region 4 of the MOS transistor and adjacent active region 4 of a MOS transistor provided in the direction of the arrow 7 is about 200 nm. The interval between the active region 4 of the MOS transistor and adjacent active region 4 of a MOS transistor provided in the direction of the arrow 8 is about 200 nm. The gate electrode 3 is mainly composed of polysilicon (poly-Si). Alternatively, the gate electrode 3 may be composed of a silicide or a metal. A gate oxide film is formed directly under the gate electrode 3 but is not shown because the gate oxide film has a significantly small thickness. FIG. 1B is a cross-sectional view taken along an arrow represented by a dotted line drawn between A and B in FIG. 1A.

FIG. 1B shows the STI region surrounding the active region 4, and the periphery of the active region 4 of the MOS transistor. FIG. 1B also shows the active region 4 of the MOS transistor isolated by a groove formed in the silicon substrate 11, and the STI region filled with HDP-SiO₂. The STI region has a depth of about 350 nm. In the typical MOS transistor shown in FIGS. 1A and 1B, the STI region is usually filled with a single insulating material such as HDP-SiO₂ 9. In this case, a strain in the active region of the MOS transistor is produced only by the single insulating material. Thus, it is difficult to freely adjust the direction and magnitude of the strain.

Figure 2A:
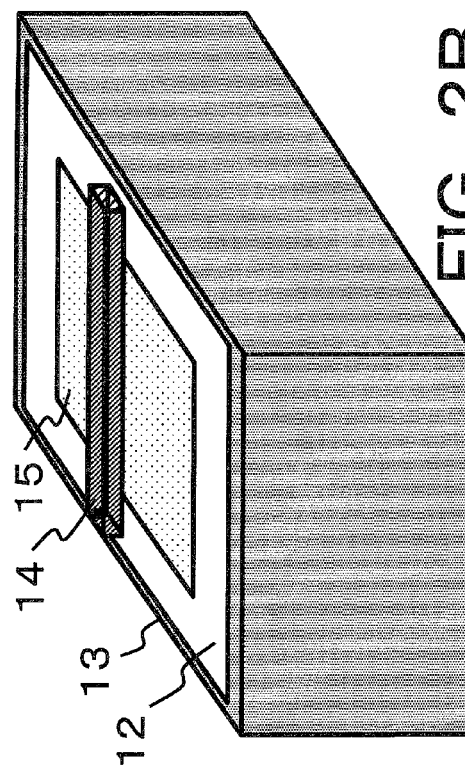
FIGS. 2A and 2B are schematic perspective views illustrating MOS transistors of a semiconductor device according to a first embodiment.
Figure 2B:
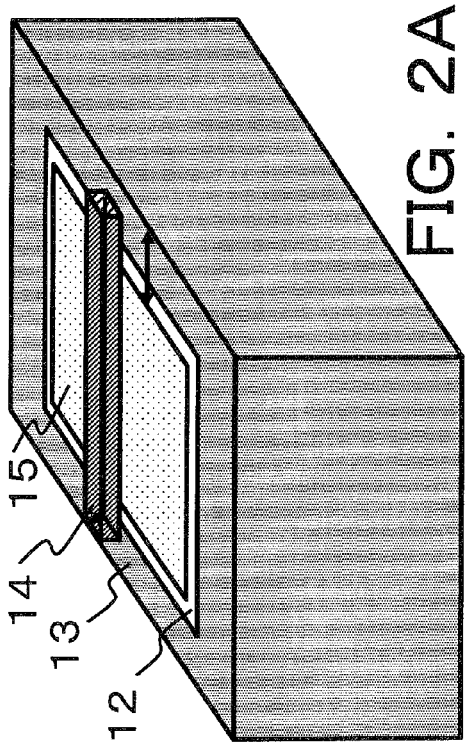
Figure 2C:
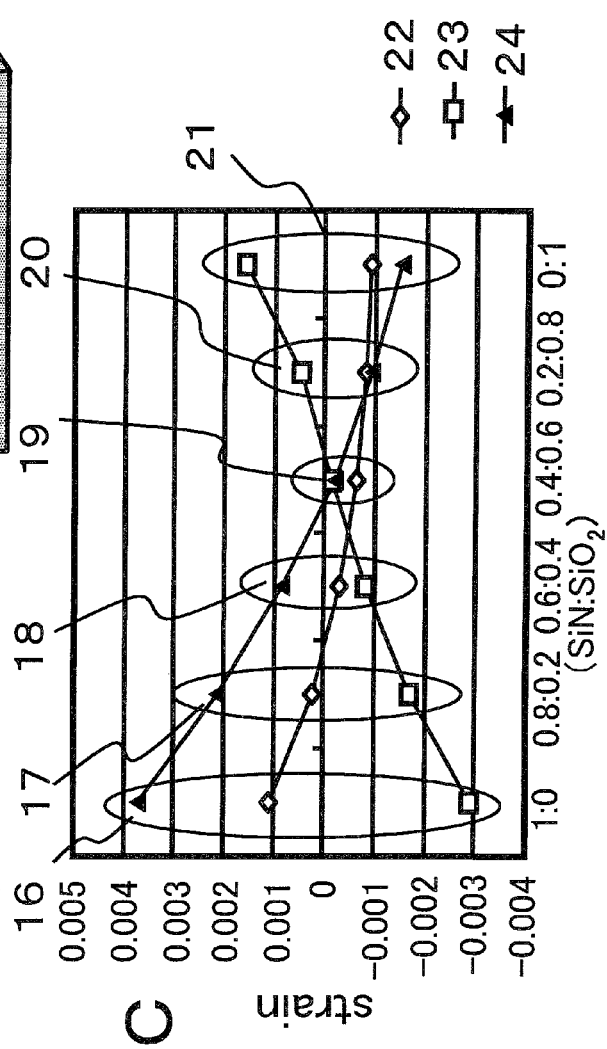
FIG. 2C is a graph showing strain in active regions of MOS transistors according to the first embodiment.

FIGS. 2A and 2B are schematic perspective views illustrating structures of MOS transistors in semiconductor devices according to the first embodiment. FIG. 2C is a graph showing strain in active regions of MOS transistors according to the first embodiment. FIGS. 2A, 2B, and 2C show a SiN (silicon nitride) layer 12, a SiO₂ layer 13, a gate electrode 14, an active region 15 of a MOS transistor, a strain 16 when the STI region is filled with the SiN layer 12 alone, a strain 17 when the STI region is filled with the SiN layer 12 and the SiO₂ layer 13 in a ratio of 0.8:0.2, a strain 18 when the STI region is filled with the SiN layer 12 and the SiO₂ layer 13 in a ratio of 0.6:0.4, a strain 19 when the STI region is filled with the SiN layer 12 and the SiO₂ layer 13 in a ratio of 0.4:0.6, a strain 20 when the STI region is filled with the SiN layer 12 and the SiO2 layer 13 in a ratio of 0.2:0.8, a strain 21 when the STI region is filled with the SiO₂ layer 13 alone, a solid line 22 representing a strain in the X direction, a solid line 23 representing a strain in the Y direction, and a solid line 24 representing a strain in the Z direction. In other words, the schematic structures of the MOS transistors according to the first embodiment shown in FIGS. 2A and 2B are characterized in that the STI region is filled with a material (stressor), such as the SiN layer 12 or the SiO$_2$ layer 13, producing tensile strain or compressive strain or a combination of such stressors.

FIG. 2A shows the STI region formed around the active region 15 of the MOS transistor included in the semiconductor device. The ratio of the width of the SiN layer 12 to the width of the SiO$_2$ layer 13 in a trench in the STI region is 0.2:0.8. The term "trench" means part of the groove and one of the portions into which the groove that isolates the active regions is divided at half the spacing between adjacent active regions. The phrase "width of each of the layers, such as the SiN layer 12 and the SiO$_2$ layer 13, in the trench" means a width when the surface of the semiconductor is viewed in the direction normal to the surface of the semiconductor.

The SiN layer 12 is formed on the bottom of the STI region. A 0.2-μm-width circular region surrounding the periphery of each active region is filled with the SiN layer 12 when viewed in the direction normal to the surface of the semiconductor device. In the groove, a region other than the circular region filled with the SiN layer 12 is filled with the SiO$_2$ layer 13. Thus, a material with which the groove is filled is constituted by a combination of the SiN layer 12 and the SiO$_2$ layer 13. As similarly shown in FIG. 1A, the active region 15 is 400 nm long and W wide. Adjacent active regions 15 are spaced at intervals of 200 nm.

Details of a method for manufacturing the semiconductor device shown in FIG. 2A will be described below with reference to FIGS. 5A to 5H. The method for manufacturing the semiconductor device shown in FIG. 2A includes uniformly forming the SiN layer 12 (for example, thermal expansion coefficient: 3.3 ppm) in the STI region and then forming the SiO$_2$ layer 13 (for example, thermal expansion coefficient: 0.6 ppm).

FIG. 2B shows the STI region formed around the MOS transistor and the active region 15 as in FIG. 2A, except that the ratio of the thickness of the SiN layer 12 to the thickness of the SiO$_2$ layer 13 in the STI region is 0.8:0.2.

FIG. 2C shows a graph showing strain in the active regions 15 of the MOS transistors when the STI regions are filled with the SiN layers 12 and the SiO$_2$ layers 13, assuming that the ratios of the width of the SiN layer 12 to the width of the SiO$_2$ layer 13 in the trench are 0.8:0.2 ((17), FIG. 2A) and 0.2:0.8 ((20), FIG. 2B) and that the ratios of the width of the SiN layer 12 to the width of the SiO$_2$ layer 13 in the trench are 1:0 ((16)), SiN layer 12 alone), 0.6:0.4 ((18)), 0.4:0.6 ((19)), and 0:1 ((21)), SiO$_2$ layer 13 alone). In the graph described above, the vertical axis represents strain (determined by dividing an extended length by an initial length), and the horizontal axis represents the ratios of the width of the SiN layer 12 to the width of the SiO$_2$ layer 13 in the trench. With respect to the direction of strain, a strain in the direction of the source-drain is referred to as a strain ($\epsilon$x) 22 in the X direction. A strain in the direction perpendicular to the substrate is referred to as a strain ($\epsilon$y) 23 in the Y direction. A strain in the longitudinal direction of the gate electrode is referred to as a strain ($\epsilon$z) 24 in the Z direction. Open rhombuses and a solid line connecting the open rhombuses represent the strain ($\epsilon$x) 22 in the X direction. Open quadrangles and a solid line connecting the open quadrangles represent the strain ($\epsilon$y) 23 in the Y direction. Filled triangles and a solid line connecting the filled triangles represent the strain ($\epsilon$z) 24 in the Z direction. The symbols such as the open rhombus depicted at the left end represent the strain values at a ratio of 1:0. The strain values at ratios of 0.8:0.2, 0.6:0.4, 0.4:0.6, 0.2:0.8, and 0:1 are sequentially depicted.

The strain produced in the region directly below the active region 15 can be calculated by commercially available software for finite element method. In other words, in the case where the STI region is filled with the SiN layer 12 and the SiO$_2$ layer 13 in such a manner that the ratios of the thickness of the SiN layer 12 to the thickness of the SiO2 layer 13 are the six ratios described above, the strain produced in the active region 15 of the MOS transistor at room temperature (25° C.) can be calculated on the basis that the strain is produced by changes in the volume of the silicon crystal, the SiN layer 12, and the SiO$_2$ layer 13 due to the difference in thermal expansion coefficient among these materials as the temperature decreases to room temperature on the assumption that no strain is produced at 700° C.

For example, a silicon crystal has a thermal expansion coefficient of about 2.6 ppm. The SiN layer 12 (for example thermal expansion coefficient: 3.3 ppm) is composed of a typical material having a thermal expansion coefficient larger than that of the silicon crystal and is a stressor producing a tensile strain. The SiO$_2$ layer 13 (for example, thermal expansion coefficient: 0.6 ppm) is composed of a typical material having a thermal expansion coefficient smaller than that of the silicon crystal and is a stressor producing a compressive strain.

In the case where the groove is filled with a material having a thermal expansion coefficient larger than that of the silicon crystal (in this case, the material is the SiN layer 12 having a thermal expansion coefficient of 3.3 ppm), when the temperature is reduced from a film-forming temperature, the material with which the groove is filled shrinks more. Thus, the in-plane strain (strain ($\epsilon$x) 22 in the X direction and strain ($\epsilon$z) 24 in the Z direction) is a tensile strain (strain>0, i.e., expressed as a positive value). As a result, the strain in the vertical direction (strain ($\epsilon$y) 23 in the Y direction) is a compressive strain (strain<0, i.e., expressed as a negative value). In the case where the groove is filled with a material having a thermal expansion coefficient smaller than that of the silicon crystal (in this case, the material is the SiO$_2$ layer 13 having a thermal expansion coefficient of 0.6 ppm), the in-plane strain (strain ($\epsilon$x) 22 in the X direction and strain ($\epsilon$z) 24 in the Z direction) is a compressive strain (strain<0). As a result, the strain in the vertical direction (strain ($\epsilon$y) 23 in the Y direction) is a tensile strain (strain>0).

When the graph of FIG. 2C is obtained, to reduce the amount of calculation, the boundary condition is set in such a manner that the MOS transistor and the like shown in FIG. 2A or 2B are arrayed in a matrix, i.e., an intermediate line between the STI regions is defined as the boundary of a period. The width of the STI region, i.e., the distance between adjacent active regions 15 is set at 200 nm. The active region 15 has a length of 400 nm and a width (W) of 200 nm. It is understood that strain in the active region 15 can also be calculated using the distance between adjacent active regions 15 as a parameter. Alternatively, strain in the active region 15 can also be calculated using the width W (W also representing the width of the gate in the longitudinal direction) of the active region 15 as a parameter.

The graph of FIG. 2C shows that a change in the ratio of the width of the SiN layer 12 and the width of the SiO$_2$ layer 13 in the trench, i.e., a change in the combination ratio of different stressor, results in a significant change in strain in the active region 15. Furthermore, it is found that the stress directly under the gate may be set to zero by appropriately combining the material (stressor producing a tensile strain) having a thermal expansion coefficient larger than the silicon crystal with a material (stressor producing a compressive strain) having a thermal expansion coefficient smaller than the silicon crystal. For example, in the case where the ratio of the width of the SiN layer 12 to the width of the SiO$_2$ layer 13 in the trench is 0.4:0.6, the strain directly under the gate is achieved to be about zero. Thus, it is found that changing the ratio of the width of the SiN layer 12 to the width of the SiO$_2$ layer 13 in the trench controls the strain in the active region 15, the SiN layer 12 and the SiO$_2$ layer 13 being arranged in the STI region serving as the element isolation region arranged to isolate the active region of the MOS transistor.

FIGS. 3A to 3D are graphs showing changes in strain in active regions of MOS transistors and changes in the properties of the MOS transistors as the width W of a gate electrode in the longitudinal direction is changed.

Figure 3A:
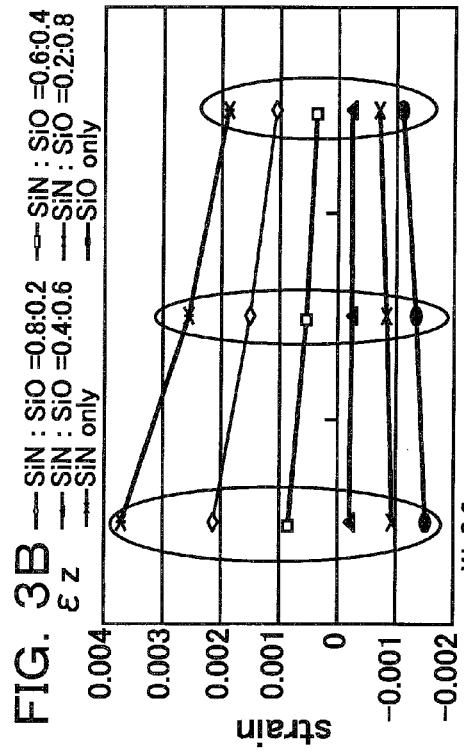
FIGS. 3A to 3D are graphs showing changes in strain in active regions of MOS transistors and changes in the properties of the MOS transistors as the width W of a gate electrode in the longitudinal direction is changed.
Figure 3B:
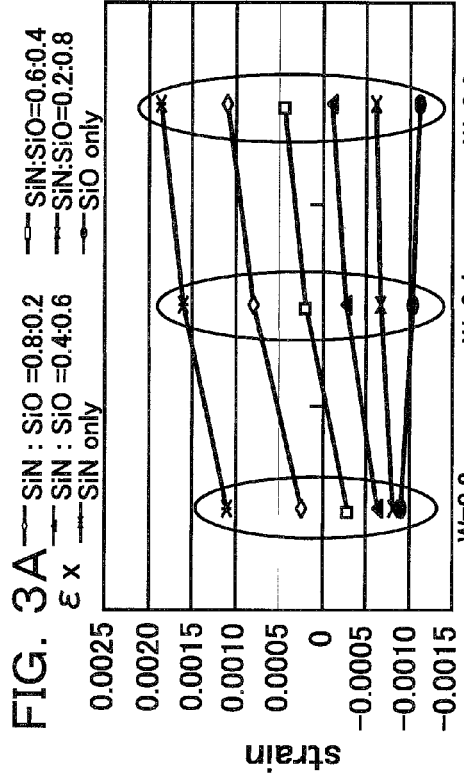

FIG. 3A is a graph showing a change in strain ($\epsilon$x) in the source-drain direction (x direction). FIG. 3B is a graph showing a change in strain ($\epsilon$z) the longitudinal direction of the gate electrode (Z direction). In each of FIGS. 3A and 3B, the vertical axis represents strain, and the horizontal axis represents W, which refers to the width of the active region in the longitudinal direction of the gate electrode, in units of μm.

Figure 3C:
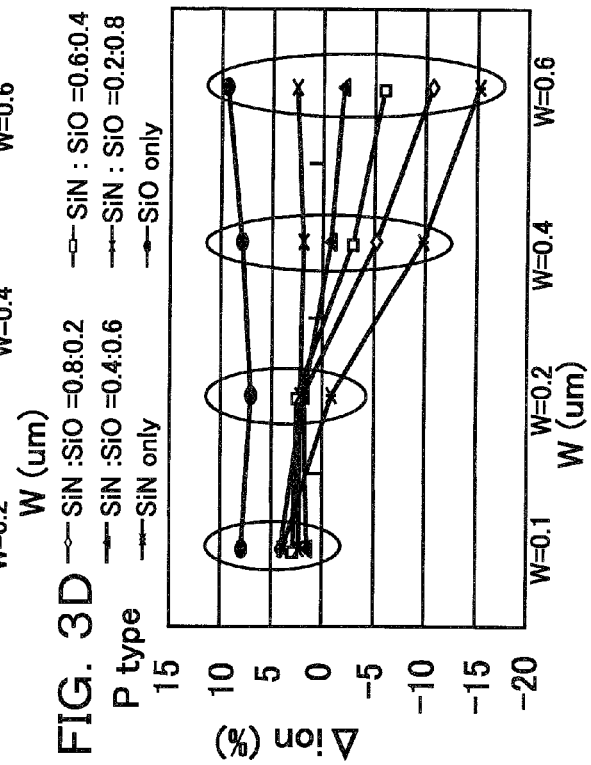
Figure 3D:
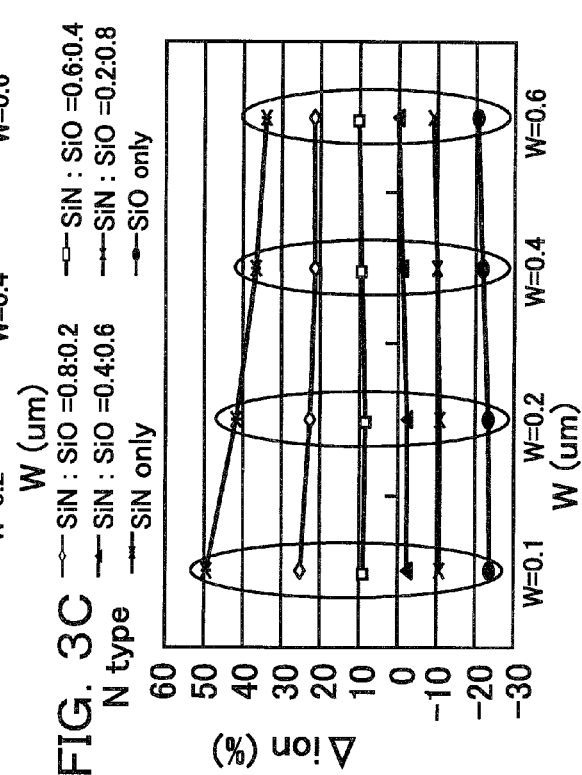

FIG. 3C is a graph showing a change in the property of an N-type MOS transistor. FIG. 3D is a graph showing a change in the property of a P-type MOS transistor. In each of FIGS. 3C and 3D, the vertical axis represents a change (%) in output current. An increase in output current is represented by a positive value. A decrease in output current is represented by a negative value. The horizontal axis represents the width W of the active region in the longitudinal direction of the gate electrode, in units of μm. In preparing the graphs of FIGS. 3C and 3D, the change in a property of the N-type or P-type MOS transistor is calculated on the basis of a mathematical expression representing the relationship between the strain applied to a gate region and the transistor property, the mathematical expression being described in documents, for example, SSDM pp. 14-15, 2002 (Hitachi).

In each of FIGS. 3A to 3D, open rhombuses and a solid line connecting the open rhombuses represent the strain or the property of the output current of the MOS transistor when the ratio of the width of the SiN layer in the trench to the width of the SiO2 layer in the trench is 0.8:0.2. Similarly, open quadrangles and a solid line connecting the open quadrangles represent the strain or the property of the output current of the MOS transistor when the ratio of the width of the SiN layer in the trench to the width of the SiO2 layer in the trench is 0.6:0.4. Filled triangles and a solid line connecting the filled triangles represent the strain or the property of the output current of the MOS transistor when the ratio of the width of the SiN layer in the trench to the width of the SiO2 layer in the trench is 0.4:0.6. Symbols x and a line connecting the symbols x represent the strain or the property of the output current of the MOS transistor when the ratio of the width of the SiN layer in the trench to the width of the SiO2 layer in the trench is 0.2:0.8. Symbols (*) and a line connecting the symbols represent the strain or the property of the output current of the MOS transistor in the case of the SiN layer alone. Filled circles and a solid line connecting the filled circles represent the strain or the property of the output current of the MOS transistor in the case of the SiO2 alone.

As shown in FIGS. 3A to 3D, in the case where the ratio of the thickness of the SiN layer to the width of the SiO2 layer in the trench is 0.4:0.6, there are substantially no strains ($\epsilon$x) in the X direction, strains ($\epsilon$z) in the Z direction, change in the property of the N-type MOS transistor, or change in the property of the P-type MOS transistor. It is also found that the change in strain ($\epsilon$x) in the X direction, the change in strain ($\epsilon$z) in the Z direction, the change in the property of the N-type MOS transistor, and the change in the property of the P-type MOS transistor, which depend on the width W of the active region in the longitudinal direction of the gate electrode, are small. In other words, the strains in the longitudinal direction of the gate electrode and in the source-drain direction can be adjusted by combining a plurality of stressors as the materials with which the STI region is filled and by adjusting the combination ratio of the plurality of stressors, thereby suppressing the change in the property of the MOS transistor, which depends on the width W of the active region in the longitudinal direction of the gate electrode. Similarly, both of the change in the property of the N-type MOS transistor and the change in the property of the P-type MOS transistor can be suppressed.

In contrast, to obtain a predetermined change in the property of the MOS transistor, the thickness of the SiN layer and the thickness of the SiO2 layer in the STI region may be adjusted in response to the change in the property of the MOS transistor. This is because the strain in the active region of the MOS transistor can be adjusted in response to the ratio of the thickness of the SiN layer and the thickness of the SiO2 layer in the STI region.

Figure 4:
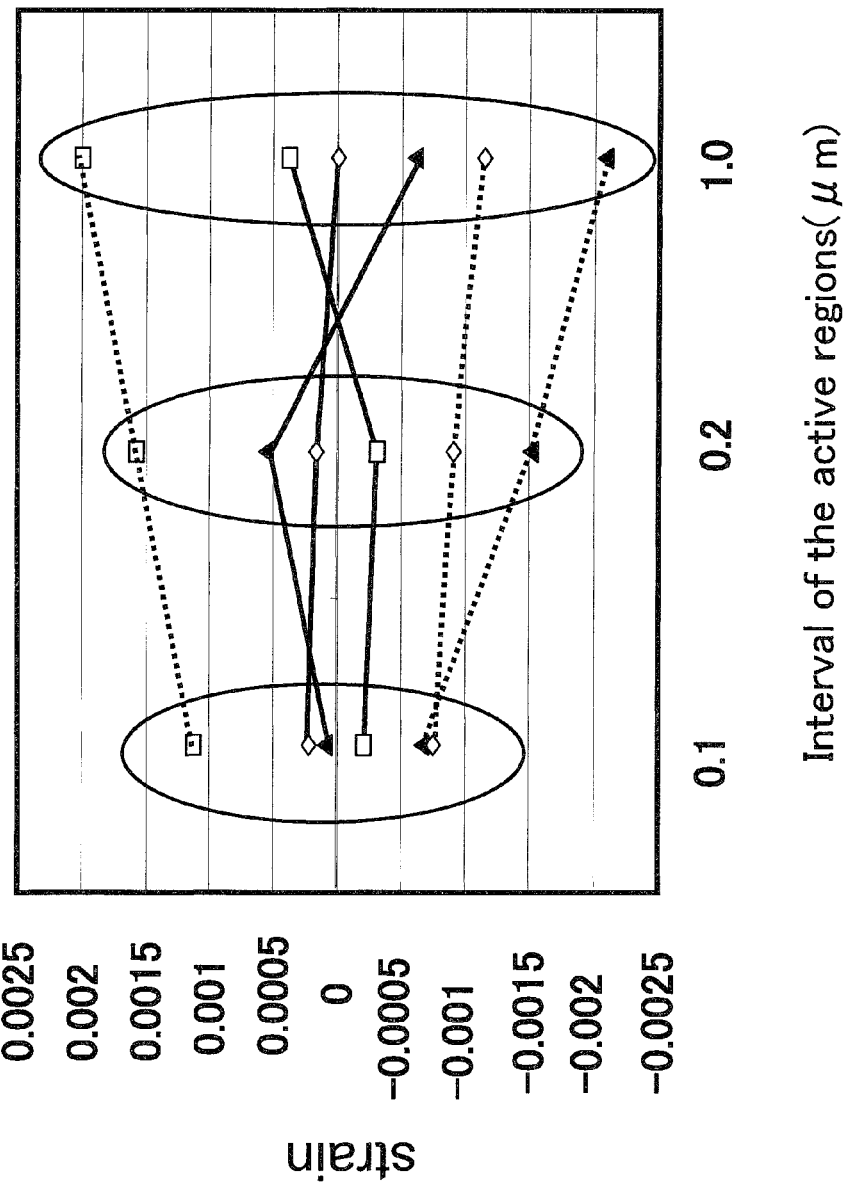
FIG. 4 is a graph showing the results of the calculation of strain in an active region when the interval of active regions of adjacent MOS transistors is used as a parameter.

FIG. 4 is a graph showing the results of the calculation of strain in an active region when the interval of active regions of adjacent MOS transistors is used as a parameter. The vertical axis in the graph of FIG. 4 represents the strain. The horizontal axis represents the interval of the active regions at intervals of 0.1 μm, 0.2 μm, and 1.0 μm, the values being spaced uniformly. Open rhombuses and a solid line connecting the open rhombuses represent the strain in the active region in the X direction (source-drain direction) when the thickness of the SiN layer:thickness of the SiO2 layer=0.4:0.6. Open quadrangles and a solid line connecting the open quadrangles represent the strain in the active region in the Y direction (vertical direction) when the thickness of the SiN layer:thickness of the SiO2 layer=0.4:0.6. Filled triangles and a solid line connecting the filled triangles represent the strain in the active region in the Z direction (longitudinal direction of the gate electrode) when the thickness of the SiN layer:thickness of the SiO2 layer=0.4:0.6. Open rhombuses and a dotted line connecting the open rhombuses represent the strain in the active region in the X direction (source-drain direction) in the case of SiO2 alone. Open quadrangles and a dotted line connecting the open quadrangles represent the strain in the active region in the Y direction (vertical direction) in the case of SiO2 alone. Filled triangles and a dotted line connecting the filled triangles represent the strain in the active region in the Z direction (longitudinal direction of the gate electrode) in the case of SiO2 alone.

The graph of FIG. 4 shows that when the groove that isolates the active regions of the MOS transistors is filled with the filling material constituted by the stressor such as a SiN layer producing a tensile strain and the stressor such as SiO2 producing a compressive strain in such a manner that the thickness of the SiN layer:thickness of the SiO2 layer=0.4:0.6, the strain in the active region of the MOS transistor can be adjusted to be substantially zero. Furthermore, in any interval of the active regions, when the groove that isolates the active regions of the MOS transistors is filled with the stressors in the above-described ratio, the strain in the active region of the MOS transistor can be set to be substantially zero. In other words, the dependence of the strain on the interval of the active regions of adjacent MOS transistors is small, thereby suppressing nonuniformity in the property of the MOS transistor.

FIGS. 5A to 5H are cross-sectional views illustrating a method for manufacturing the semiconductor devices showing in FIGS. 2A and 2B. FIGS. 5A to 5H show a silicon substrate 27, a SiO2 film 26, a SiN film 25, a groove 28, a SiO2 layer 29, and a SiN layer 30.

Figure 5A:
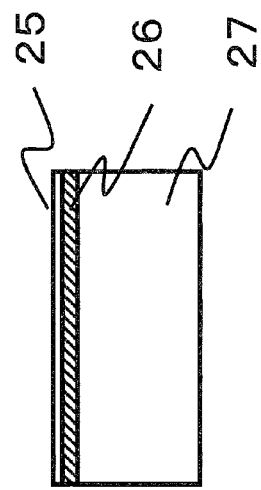
FIGS. 5A to 5H are cross-sectional views illustrating a method for manufacturing the semiconductor devices showing in FIGS. 2A and 2B.

FIG. 5A shows a state in which the SiO2 film 26 is formed on the silicon substrate 27 and then the SiN film 25 is formed thereon. The SiO2 film 26 has a thickness of about 100 mm. The SiN film 25 has a thickness of about 50 nm.

Figure 5B:
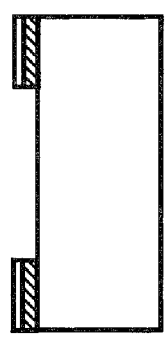

FIG. 5B shows a state in which an opening is formed in portions of the SiO2 film 26 and the SiN film 25, the portions corresponding to the groove 28 in the STI region. Specifically, a resist pattern having an opening at a portion corresponding to the groove 28 is formed by photolithography after the step shown in FIG. 5A. Anisotropic etching is performed with the resist pattern as an etching mask to remove the portions of the SiO2 film 26 and the SiN film 25, the portions corresponding to the groove 28, thereby forming the opening in the SiO2 film 26 and the SiN film 25. Removal of the resist pattern results in the cross section structure shown in FIG. 5B.

Figure 5C:
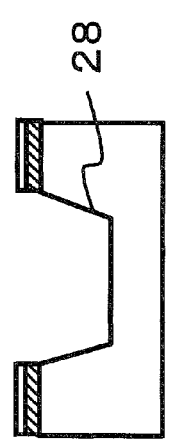

FIG. 5C shows a state in which the groove 28 is formed in a portion of the silicon substrate 27 corresponding to the opening through the SiO2 film 26 and the SiN film 25 by anisotropic dry etching.

Figure 5D:
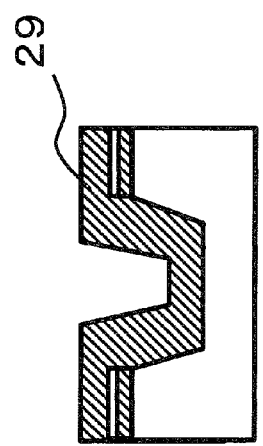

FIG. 5D shows a state in which the SiN layer 29 is formed by chemical vapor deposition (CVD) after the step described above. The conditions for forming the SiN layer 29 are determined in such a manner that a uniform thickness is obtained. The width of the groove 28 is larger than the thickness of the SiN layer 29; hence, the groove 28 is partially filled with the SiN layer 29.

Figure 5E:
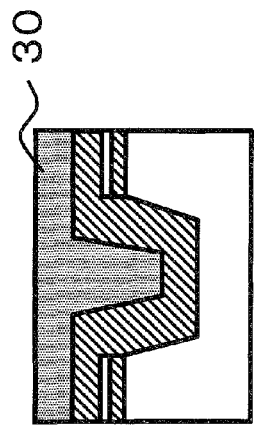

FIG. 5E shows a state in which the SiO2 layer 30 is formed by CVD after the step described above. The conditions for forming the SiO2 layer 30 are determined in such a manner that the groove 28 is completely filled with the SiO2 layer 30.

Figure 5F:
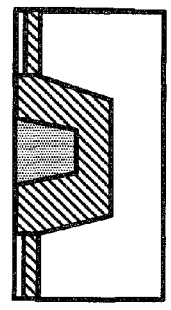

FIG. 5F shows a state in which the SiN layer 29 and the SiO2 layer 30 on the SiN film 25 are removed by chemical-mechanical polishing (CMP) to perform planarization after the step described above.

Figure 5G:
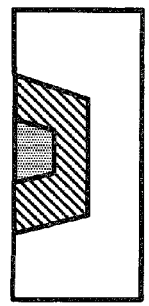

FIG. 5G shows a state in which the SiN layer 29 and the SiO2 layer 30 used as the etching mask are removed after the step described above.

Figure 5H:
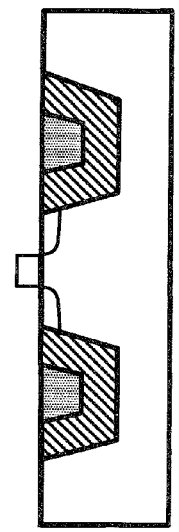

FIG. 5H shows a state in which a gate oxidation film of a MOS transistor is formed by thermal oxidation on a surface of the semiconductor between the grooves 28, i.e., on an active region, to form a gate electrode of the MOS transistor, and then a source subregion and a drain subregion of the MOS transistor are formed by ion implantation with impurities.

As described above, the semiconductor device according to the first embodiment includes the active regions in which the MOS transistors are formed, the groove that isolates the active regions, and the element isolation region arranged in the groove and formed of the filling material constituted by a combination of the stressor producing a tensile strain and the stressor producing a compressive strain. The SiN layer 12 producing a tensile strain is arranged in the circular region surrounding the periphery of each active region when viewed in the direction normal to the surface of the semiconductor device. In the groove, a region other than the circular region filled with the SiN layer 12 is filled with the $SiO_2$ layer 13 producing a compressive strain.

To achieve predetermined properties of the MOS transistor, the width of the circular region surrounding the active region is determined in response to the strain in the active region of the MOS transistor.

In the semiconductor device according to the first embodiment, predetermined properties of the MOS transistor can be advantageously set by a combination of the plurality of stressors. For example, the strain in the active region of the MOS transistor can be set to be substantially zero by adjustment of the combination ratio of the stressor producing a tensile strain to the stressor producing a compressive strain. This advantageously results in stable properties of the N-type MOS transistor and the P-type MOS transistor.

The method for manufacturing the semiconductor device according to the first embodiment includes the steps of forming the groove that isolates the active regions in the semiconductor substrate, depositing the stressor that produces a tensile strain, depositing the stressor that produces a compressive strain, and planarizing the surface of the semiconductor substrate. The method for manufacturing the semiconductor device according to the first embodiment further includes a step of forming the MOS transistor in the active region.

The semiconductor device manufactured by the method for manufacturing the semiconductor device according to the first embodiment advantageously includes the MOS transistor in which the strain in the active region of the MOS transistor is adjusted by the combination of the stressors. In this case, a circuit including the MOS transistor having predetermined properties can be advantageously produced.

As described above, in the case where the SiN layer is used as the stressor producing a tensile strain and the SiO2 layer is used as the stressor producing a compressive strain, to suppress unevenness in the properties of the MOS transistor, the conditions in which the thickness of the SiN layer:thickness of the SiO2 layer=0.4:0.6 are optimum. However, the ratio described above can vary depending on the thermal expansion coefficient of a material used and a filling state. For example, as a material having a thermal expansion coefficient larger than that of the silicon crystal, the SiN layer having a thermal expansion coefficient of is used 3.3 ppm is used. The thermal expansion coefficient of the SiN layer is known to be changed by the film-forming conditions. In this case, naturally, the ratio is changed. Under some conditions, the material may have different thicknesses at the bottom and side walls in the STI region. In this case, the combination ratio is further changed.

A combination of the material (stressor producing a tensile strain) having a thermal expansion coefficient larger than that of the silicon crystal and the material (stressor producing a compressive strain) having a thermal expansion coefficient smaller than that of the silicon crystal significantly controls the strain directly under the gate. Examples of an insulator having a thermal expansion coefficient larger than that of the silicon crystal include SiOC (silicon oxycarbide), SiCN (silicon carbonitride), SiC (silicon carbide), and SiOCN (silicon oxycarbonitride). A conventional SiOC has, for example, a thermal expansion coefficient of about 8.0 ppm. A conventional SiC has, for example, a thermal expansion coefficient of about 7.5 ppm. SiON, SiOCN, and the like have values between the thermal expansion coefficients of SiN and SiC. Thus, for example, SiOC has a thermal expansion coefficient larger than that of SiN that is used for the calculation of the strain. Accordingly, the same effect is provided even when the thickness of a SiOC layer, a SiC layer, a SiCN layer, a SiOCN layer, or the like is smaller than that of the SiN layer. The materials containing C, such as SiOC, SiCN, SiC, and SiOCN, are often used as low-k materials for insulating films surrounding Cu leads and are mainly formed by CVD. Thus, there is no need to purchase new production equipment, suppressing an increase in cost.

Second Embodiment

A second embodiment relates to a semiconductor device including an STI region formed of a groove which isolates active regions and is filled with a filling material composed of a combination of a material that produces a tensile strain and that is arranged in a specific portion of the groove and a material that produces a compressive strain and that is arranged in another specific portion of the active region. The second embodiment will be described with reference to FIGS. 6A, 6B, and 7A to 7C. Hereinafter, a material producing strain is referred to as a "stressor" in the second embodiment.

FIGS. 6A and 6B are perspective views illustrating active regions of MOS transistors and STI regions filled with stressor materials of the semiconductor device according to the second embodiment. FIGS. 6A and 6B show a source subregion 31 of a MOS transistor, a drain subregion 32 of the MOS transistor, a gate electrode 33 of the MOS transistor, an active region 34 of the MOS transistor, an arrow 37 indicating the distance between adjacent regions in a transverse direction, an arrow 38 indicating the distance between adjacent regions in a longitudinal direction, HDP-SiO2 39, and a SiN layer 40.

FIG. 6A shows a MOS transistor including the gate electrode 33, the active region 34 of the MOS transistor, and a STI region surrounding the periphery thereof. A portion of the STI region extending parallel to the longitudinal direction of the gate electrode 33 and being in contact with the drain subregion 32 is filled with HDP-SiO2 39. A portion of the STI region extending parallel to the longitudinal direction of the gate electrode 33 and being in contact with the source subregion 31 is filled with HDP-SiO2 39. The SiN layers 40 are arranged in portions of the STI region extending parallel to the direction in which the source subregion 31 and the drain subregion 32 are connected (direction orthogonal to the longitudinal direction of the gate electrode), the portions being in contact with the right and left ends of the active region 34.

FIG. 6B shows a MOS transistor, the active region 34, and an STI region, as in FIG. 6A. A portion of the STI region extending parallel to the longitudinal direction of the gate electrode 33 and being in contact with the drain subregion 32 is filled with the SiN layer 40. A portion of the STI region extending parallel to the longitudinal direction of the gate electrode 33 and being in contact with the source subregion 31 is filled with the SiN layer 40. Portions of the STI region extending parallel to the direction in which the source subregion 31 and the drain subregion 32 are connected (direction orthogonal to the longitudinal direction of the gate electrode 33) and being in contact with the right and left ends of the active region 34 are filled with HDP-SiO2 (39).

As shown in FIGS. 6A and 6B, the STI region surrounding the active region 34 of the MOS transistor is divided into substantially rectangular portions adjacent to sides of the active region 34 when viewed in plan.

HDP-SiO2 (39) arranged in the substantially rectangular portion directly under the gate electrode and in the groove parallel to the direction in which the source subregion and the drain subregion are connected serves as a stressor producing a compressive strain. The SiN layer 40 arranged directly under the gate electrode and in the groove parallel to the direction in which the source subregion and the drain subregion are connected serves as a stressor producing a tensile strain.

In FIG. 6A, thus, a tensile strain is produced in the active region 34 in the longitudinal direction of the gate electrode 33. A compressive strain is produced in the active region 34 in the direction in which the source subregion 31 and the drain subregion 32 (direction orthogonal to the longitudinal direction of the gate electrode 33. In FIG. 6B, a compressive strain is produced in the active region 34 in the longitudinal direction of the gate electrode 33. A tensile strain is produced in the active region 34 in the direction in which the source subregion 31 and the drain subregion 32 (direction orthogonal to the longitudinal direction of the gate electrode 33.

FIGS. 7A to 7C are graphs showing changes in the state of strain in the active regions and changes in the properties of the MOS transistors shown in FIGS. 6A and 6B.

FIG. 7A is a graph in which strain values in the active regions shown in FIGS. 6A and 6B are incorporated in the graph of FIG. 2C. The vertical and horizontal axes shown in the graph of FIG. 7A have the same meanings as in the graph of FIG. 2C. The same is true for symbols and solid lines connecting the symbols, except that the strain values in the active regions are added to the symbols and the solid lines connecting the symbols representing the strain in the X direction, the strain in the Y direction, and the strain in the Z direction.

FIG. 7B is a graph in which the changes in the properties of the MOS transistors (proportion of the changes in output current) are incorporated in the graph of FIG. 3C. The vertical and horizontal axes shown in the graph of FIG. 7B have the same meanings as in the graph of FIG. 3C. The same is true for symbols and solid lines connecting the symbols, except that when the MOS transistors shown in FIGS. 6A and 6B are N-type MOS transistors, changes in the properties of the N-type MOS transistors are represented by crosses and a solid line connecting the crosses and filled rectangles and a solid line connecting the filled rectangles.

FIG. 7C is a graph in which the changes in the properties of the MOS transistors (proportion of the changes in output current) are incorporated in the graph of FIG. 3D. The vertical and horizontal axes shown in the graph of FIG. 7C have the same meanings as in the graph of FIG. 3C. The same is true for symbols and solid lines connecting the symbols, except that when the MOS transistors shown in FIGS. 6A and 6B are P-type MOS transistors, changes in the properties of the P-type MOS transistors are represented by crosses and a solid line connecting the crosses and filled rectangles and a solid line connecting the filled rectangles.

FIGS. 7A, 7B, and 7C show that the strains ($\epsilon x$ and $\epsilon z$) in the active regions, shown in FIGS. 6A and 6B, in the in-plane direction are significantly larger than the strains ($\epsilon x$ and $\epsilon z$) in the active regions, shown in FIGS. 2A and 2B, in the in-plane direction.

With respect to the N-type MOS transistor, the percentage of change in the property of the MOS transistor shown in FIG. 6A is large compared with the changes in the properties of the MOS transistors shown in FIGS. 2A and 2B. It is found that the state of the strain in the active region shown in FIG. 6A can be adjusted by arranging the stressor in the STI region as shown in FIG. 6A in such a manner that the N-type MOS transistor has satisfactory properties.

With respect to the P-type MOS transistor, the percentage of change in the property of the MOS transistor shown in FIG. 6B is large compared with the changes in the properties of the MOS transistors shown in FIGS. 2A and 2B. It is found that the state of the strain in the active region shown in FIG. 6B can be adjusted by arranging the stressor in the STI region as shown in FIG. 6B in such a manner that the P-type MOS transistor has satisfactory properties.

The semiconductor device according to the second embodiment includes the STI region formed of the groove which isolates the active regions having the N-type MOS transistor or the P-type MOS transistor and is filled with the filling material composed of the combination of the stressor material that produces a tensile strain and that is arranged in a block portion corresponding to the specific portion of the active region and the stressor material that produces a compressive strain and that is arranged in a block portion corresponding to another specific portion in the active region. Thus, the strain in the active region of the MOS transistor can be adjusted to a predetermined state by adjusting the arrangement of the stressor producing a tensile stress and the stressor producing a compressive stress. Therefore, the strain in the active region of the MOS transistor can be adjusted in such a manner that the MOS transistor has improved properties.

HDP-SiO2 (39) arranged in the substantially rectangular portion directly under the gate electrode and in the groove parallel to the direction in which the source subregion and the drain subregion are connected serves as a stressor producing a compressive strain. The SiN layer 40 arranged directly under the gate electrode of the P-type MOS transistor and in the groove parallel to the direction in which the source subregion and the drain subregion of the P-type MOS transistor are connected serves as a stressor producing a tensile strain.

The strain in the active region of the MOS transistor is adjusted by adjusting the arrangement of the SiN layer and the HDP-SiO2 layer as described above. Alternatively, the strain directly under the gate may be significantly controlled by adjusting the arrangement of a material (stressor producing a tensile strain) having a thermal expansion coefficient larger than that of the silicon crystal and a material (stressor producing a compressive strain) having a thermal expansion coefficient smaller than that of the silicon crystal. Examples of an insulating material having a thermal expansion coefficient larger than that of the silicon crystal include SiOC (silicon oxycarbide), SiCN (silicon carbonitride), and SiC (silicon carbide).

Third Embodiment

A third embodiment relates to a method for manufacturing the semiconductor device shown in the second embodiment. The method for manufacturing the semiconductor device according to the third embodiment will be described with reference to FIGS. 8A to 8H and 9A to 9J. Hereinafter, a material producing strain is referred to as a "stressor" in the third embodiment.

FIGS. 8A to 8H and 9A to 9J are cross-sectional views taken along line A-A' in FIG. 6B and line B-B' in FIG. 6B and illustrate steps of filling an STI region with a stressor such as SiN in the method for manufacturing the semiconductor device according to the third embodiment. FIGS. 8A to 8H and 9A to 9J show a silicon substrate 45, a SiO2 film 46, a SiN film 47, a groove 48, a SiN layer 49, HDP-SiO2 (50), and a groove 51. FIGS. 8A to 8D and 9A to 9E are cross-sectional views taken along line B-B'. FIGS. 8E to 8H and 9F to 9J are cross-sectional views taken along line A-A'.

FIGS. 8A and 8E each show a state in which the SiO2 film 46 serving as an etching mask for the formation of the groove 48 is formed on the silicon substrate 45, and then the SiN film 47 is formed thereon. The SiO2 film 46 preferably has a thickness of about 100 nm. The SiN film 47 preferably has a thickness of about 50 nm.

FIGS. 8B and 8F each show a state in which an opening is formed through the SiO2 film 46 and the SiN film 47. After the step shown in FIGS. 8A and 8E, the following steps are performed. A resist pattern having an opening corresponding to a portion to be filled with the SiN film 47, i.e., the portion being a rectangular portion parallel to the longitudinal direction of a gate electrode and being in contact with a source subregion or a drain subregion of a MOS transistor, is formed in the groove 48 by photolithography. The opening is formed through the SiO2 film 46 and the SiN film 47 by anisotropic etching with the resist pattern as an etching mask. A step of removing the resist pattern is performed to obtain the cross section structure shown in FIG. 8B.

FIGS. 8C and 8G each show a state in which the silicon substrate 45 is etched with the SiO2 film 46 and the SiN film 47 as a mask to form the groove 48 having a depth of about 0.35 μm. In this case, dry etching is performed.

FIGS. 8D and 8H each show a state in which the SiN layer 49 is formed by chemical vapor deposition (CVD) in such a manner that the bottom of the cross section taken along line A-A' is covered with the SiN layer 49, after the step shown in FIGS. 5C and 8G.

FIGS. 9A and 9F each show a state in which the SiN layer 49 deposited on the SiO2 film 46 and the SiN film 47 is removed by chemical-mechanical polishing (CMP) to perform planarization.

FIGS. 9B and 9G each show a state in which an opening is formed in a rectangular portion through the SiO2 film 46 and the SiN film 47 by photolithography and anisotropic etching in the same steps as those described in FIGS. 8B and 8F, the rectangular portion being parallel to the direction in which the source subregion and the drain subregion are connected and being in contact with both ends of the active region of the MOS transistor. Also, FIGS. 9B and 9G each show a state in which the groove 51 is formed in the groove 48 with the SiO2 film 46 and the SiN film 47 as a mask.

FIGS. 9C and 9H each show a state in which HDP-SiO2 (50) is deposited in such a manner that the bottom of the groove 51 is covered, after the step shown in FIGS. 9B and 9G.

FIGS. 9D and 9I each show a state in which HDP-SiO2 (50) deposited on the SiO2 film 46 and the SiN film 47 is removed by chemical-mechanical polishing (CMP) after the step shown in FIGS. 9C and 9H, so that planarization is performed.

FIGS. 9E and 9J each show a state in which the SiO2 film 46 and the SiN film 47 used as the etching mask are removed by isotropic etching.

The manufacture method shown in FIGS. 8A to 8H and 9A to 9J includes the steps of forming a block region, which is one of the grooves that isolate the active regions in the semiconductor substrate, to be filled with one stressor, filling the region with the one stressor, forming a block region to be filled with the other stressor, and filling with the other stressor in the region. In the embodiment shown in FIGS. 8A to 8H and 9A to 9J, the grooves that isolate the active regions of the semiconductor substrate are separately formed. In other words, the groove to be filled with the one stressor is separately formed from the groove to be filled with the other stressor. Alternatively, a groove that isolates the active regions may be formed in one operation, and then steps of filling the region to be filled with the one stressor and the region to be filled with the other stressor with the respective stressors may be performed.

According to the manufacture method shown in FIGS. 8A to 8H and 9A to 9J, the substantially rectangular region in the groove parallel to the direction in which the source subregion and the drain subregion are connected is filled with the one stressor. The substantially rectangular region in the groove parallel to the longitudinal direction of the gate electrode is filled with the other stressor. Then a gate oxide film, a gate electrode, a contact, a interconnect layer, and the like are stacked to manufacture a predetermined LSI circuit including the MOS transistor. As shown in FIGS. 7B and 7C, the MOS transistor has improved properties; hence, the LSI circuit operates at a significantly high speed.

Fourth Embodiment

A fourth embodiment relates to a method for manufacturing a semiconductor device and the semiconductor device manufactured by the method, in which different materials (hereinafter, referred to as "stressors" in the fourth embodiment) that produce strain are arranged in different portions of an STI region of the semiconductor device using different intervals of adjacent active regions.

The semiconductor device and the method for manufacturing the semiconductor device according to the fourth embodiment will be described with reference to FIGS. 10, 11A to 11H, 12A to 12F, and 13A to 13C.

FIG. 10 shows a 2 by 2 array of a matrix of a plurality of MOS transistors spaced at fixed intervals in the semiconductor device according to the fourth embodiment. FIG. 10 shows MOS transistors 55, source subregions 56 of the MOS transistors, drain subregions 57 of the MOS transistors, and gate electrodes 58 of the MOS transistors. With respect to the fixed intervals, the interval in the direction in which the source subregion 56 and the drain subregion 57 are connected differs from that in the longitudinal direction of the gate electrode. In other words, with respect to the width of the STI region that isolates the active regions of the MOS transistors, the width in the direction in which the source subregion 56 and the drain subregion 57 are connected differs from that in the longitudinal direction of the gate electrode. In particular, FIG. 10 shows an exemplary structure in which with respect to the fixed intervals of adjacent active regions, the interval in the longitudinal direction of the gate electrode 58 is set at about 0.3 μm, and the interval in the direction in which the source subregion 56 and the drain subregion 57 are connected is set at about 0.2 μm.

According to the matrix of the MOS transistors shown in the FIG. 10, as described in the following manufacturing method, a stressor material arranged in the portion of the STI region parallel to the direction in which the source subregion 56 and the drain subregion 57 are connected may be different from a stressor material arranged in the portion of the STI region parallel to the longitudinal direction of the gate electrode, using different widths of the portions of the STI region.

Each of the MOS transistors may be an N-type MOS transistor or a P-type MOS transistor.

FIGS. 11A to 11H and 12A to 12F are cross-sectional views of the MOS transistors taken along chain lines C-C' and D-D' in FIG. 10 and illustrate a method for manufacturing the matrix of the MOS transistors shown in FIG. 10. FIGS. 11A to 11H and 12A to 12F show a silicon substrate 60, a SiO2 film 61, a SiN film 62, a groove 63, a SiO2 layer 64, and a SiN layer 65.

FIGS. 11A to 11D and 12A to 12C are cross-sectional views taken along line C-C' in FIG. 10. FIGS. 11E to 11H and 12D to 12F are cross-sectional views taken along line D-D' in FIG. 10.

The width of the STI region in the cross-sectional views taken along line C-C' is larger than the width of the STI region in the cross-sectional views taken along line D-D'. For example, the width of the STI region in the cross-sectional views taken along line C-C' is about 0.3 μm. The width of the STI region in the cross-sectional views taken along line D-D' is about 0.2 μm.

FIGS. 11A and 11E each show a state in which the SiO2 film 61 serving as an etching mask is formed on the silicon substrate 60, and then the SiN film 62 is formed thereon. The SiO2 film 61 has a thickness of about 100 nm. The SiN film 62 has a thickness of about 50 nm.

FIGS. 11B and 11F each show a state in which an opening is formed through only portions of the SiO2 film 61 and the SiN film 62 corresponding to the groove 63 in the STI region. Specifically, after the step shown in FIGS. 11A and 11E, a resist is applied. A resist pattern having an opening corresponding to the groove 63 is formed by photolithography. Isotropic etching is performed with the resist pattern as an etching mask to remove the portions of the SiO2 film 61 and the SiN film 62 corresponding to the groove 63, thereby forming the opening through the SiO2 film 61 and the SiN film 62. Then removal of the resist pattern results in a cross section structure as shown in FIGS. 11B and 11F.

FIGS. 11C and 11G each show a state in which the groove 63 is formed in the silicon substrate 60 by anisotropic dry etching with the SiO2 film 61 and the SiN film 62 as the etching mask.

FIGS. 11D and 11H each show a state in which the SiO2 layer 64 is formed by chemical vapor deposition (CVD) after the step described above. The conditions for forming the SiO2 layer 64 are determined in such a manner that the layer has a uniform thickness of about 0.1 μm. Thus, in the STI region where the width of the groove 63 is 0.2 μm in the cross-sectional view taken along line D-D', the entire groove 63 is filled with the SiO2 layer 64. On the other hand, in the STI region where the width of the groove 63 is 0.3 μm in the cross-sectional view taken along line C-C', the groove 63 is partially filled with the SiO2 layer 64.

FIGS. 12A and 12D each show a state in which the SiN layer 65 is formed by CVD after the step described above. The conditions for forming the SiN layer 65 are determined in such a manner that the remaining groove 63 in the cross-sectional view taken along line C-C' is completely filled with the SiN layer 65.

FIGS. 12B and 12E each show a state in which the SiN layer 65 and the SiO2 layer 64 deposited on the SiN film 62 are removed by chemical-mechanical polishing (CMP) to perform planarization after the step described above.

FIGS. 12C and 12F each show a state in which the SiN layer 65 and the SiO2 layer 64 used as the etching mask are removed after the step described above.

According to FIGS. 11A to 11H and 12A to 12F, the STI region shown in the cross-sectional view taken along line C-C' is filled with the SiN layer 65 and the SiO2 layer 64. The STI region shown in the cross-sectional view taken along line D-D' is filled with the SiO2 layer 64 alone. Subsequently, as shown in FIG. 5H and the description of FIG. 5H, MOS transistors are formed on the active regions to form the MOS transistors as shown in FIGS. 13A and 13B.

In FIGS. 11A to 11H and 12A to 12F, the width (width shown in the cross-sectional view taken along line D-D') of the STI region parallel to the direction in which the source subregion and the drain subregion are connected is narrow, and the width (width shown in the cross-sectional view taken along line C-C') of the STI region parallel to the longitudinal direction of the gate electrode is wide. Alternatively, the width shown in the cross-sectional view taken along line D-D' may be wide, and width shown in the cross-sectional view taken along line C-C' may be narrow. In this case, the STI region shown in the cross-sectional view taken along line D-D' may be filled with the SiN layer 65 and the SiO2 layer 64, and the STI region shown in the cross-sectional view taken along line C-C' may be filled with the SiO2 layer 64 alone.

In FIGS. 11A to 11H and 12A to 12F, the SiN layer 65 is deposited after the SiO2 layer 64 is deposited; hence, the STI region having a narrow width is filled with the SiO2 layer 64 alone. Alternatively, when the SiO2 layer 64 may be formed after the SiN layer 65 is deposited, the STI region having a narrow width may be filled with the SiN layer 65 alone.

FIGS. 13A and 13B show examples of the arrangement of the SiN layer 65 and the SiO2 layer 64 in the STI region that can be formed by the method for manufacturing the semiconductor device shown in FIGS. 11A to 11H and 12A to 12F. FIG. 13C is a graph showing changes in the properties of the MOS transistors isolated by the STI region described above. FIGS. 13A, 13B, and 13C show the source subregion 56, the drain subregion 57, the gate electrode 58, the SiO2 layer 64, the SiN layer 65, an arrow 66 indicating the distance between adjacent regions in a longitudinal direction, and an arrow 67 indicating the distance between adjacent regions in a transverse direction. The same elements as those shown in FIGS. 10, 11A to 11H, and 12A to 12F are designated using the same reference numerals.

FIG. 13A shows a MOS transistor isolated by an STI region and the STI region divided by an intermediate line between adjacent MOS transistors. The width of the STI region parallel to the longitudinal direction of the gate electrode is 0.3 µm. The width of the STI region parallel to the direction in which the source subregion and the drain subregion are connected is 0.2 µm. The width of the SiO2 layer 64 arranged in the trench in the STI region is about 0.1 µm. The layer is deposited along the side walls of the STI region. Thus, the SiO2 layer 64 arranged in the STI region has a thickness of 0.2 µm. The SiN layer 65 arranged in the STI region parallel to the longitudinal direction of the gate electrode has a thickness of 0.1 µm.

FIG. 13B shows a MOS transistor and an STI region as in FIG. 13A, except that the STI region parallel to the longitudinal direction of the gate electrode is filled with the SiO2 layer 64 having a thickness of 0.1 µm, which differs from the 0.1-µm-thick SiN layer 65 arranged therein. This corresponds to, in FIG. 6A, the stressor material, such as the SiO2 layer, in place of the SiN layer is arranged in the STI region in such a manner that the ratio of the thickness of the SiO2 layer to the thickness of the SiN layer is 1:1.

The stressor materials arranged in the STI regions shown in the FIGS. 13A and 13B have intermediate states between the states of the stressor materials arranged in the STI regions shown in the FIG. 1 and FIG. 6A from the viewpoint of strain applied from the stressors to the active regions of the MOS transistors.

FIG. 13C is a graph showing changes in the properties of the MOS transistors shown in FIGS. 1A, 6A, 13A, and 13B. The changes in the properties of the MOS transistors represent changes in the output current of the MOS transistors. The changes in the properties of the MOS transistors are calculated by the same method for depicting the graphs of FIGS. 3A to 3D. The vertical axis of the graph of FIG. 13C represents the percentage of change in the output current of the MOS transistor. The horizontal axis represents the properties of the MOS transistors shown in FIGS. 1A, 13A, 13B, and 6A, in sequence. Open quadrangles and a solid line connecting the open quadrangles represent the changes in the properties of the N-type MOS transistors. Open rhombuses and a solid line connecting the open rhombuses represent the changes in the properties of the P-type MOS transistors.

FIG. 13C shows that the MOS transistors shown in FIGS. 13A and 13B have the properties intermediate between the properties of the MOS transistors shown in FIGS. 1A and 6A. This is because an intermediate strain in the active region of each of the MOS transistors is obtained by the use of the stressor material producing a tensile strain and arranged in a specific portion in the STI region and the stressor material producing a compressive strain and arranged in another specific portion.

The semiconductor device according to the fourth embodiment includes the STI region formed of the groove which isolates the active regions having the N-type MOS transistor or the P-type MOS transistor and is filled with the filling material composed of the combination of the stressor material that produces a tensile strain and that is arranged in a portion corresponding to the specific portion of the active region and the stressor material that produces a compressive strain and that is arranged in a portion corresponding to another specific portion of the active region. Thus, the strain in the active region of the MOS transistor can be adjusted into a predetermined state by adjusting the arrangement of the stressor producing a tensile stress and the stressor producing a compressive stress.

The method for manufacturing the semiconductor device according to the fourth embodiment includes the step of forming the groove in such a manner that the width of the groove in the STI region parallel to the longitudinal direction of the gate electrode differs from the width of the groove in the STI region parallel to the direction in which the source subregion and the drain subregion are connected. The method for manufacturing the semiconductor device according to the fourth embodiment further includes the steps of depositing a first stressor material to form a uniform layer having a thickness such that the narrow STI region is completely filled with the layer and then depositing a second stressor material in such a manner that the wide STI region is completely filled with the material.

In this case, the structure of the stressor material arranged in the narrow STI region is advantageously different from the structure of the stressor material arranged in the wide STI region.

Fifth Embodiment

A fifth embodiment relates to a method for manufacturing a semiconductor device, the method including alternately and repeatedly depositing a plurality of materials (hereinafter, referred to as "stressors" in the fifth embodiment) that produce strain, so that the stressors arranged in a STI region of the semiconductor device are adjusted in such a manner that a predetermined ratio of the thicknesses of the stressors is achieved. The method for manufacturing the semiconductor device according to the fifth embodiment will be described with reference to FIGS. 14A to 14D.

FIGS. 14A to 14D relate to appendix 12.

FIGS. 14A to 14D are cross-sectional views of STI regions and active regions of MOS transistors in the semiconductor device according to the fifth embodiment. FIGS. 14A to 14D show a SiO2 layer 70, a SiN layer 71, and a silicon substrate 72.

FIGS. 14A and 14B are cross-sectional views of a narrow STI region and the active region of the MOS transistor. FIG. 14A is a cross-sectional view of the active region of the MOS transistor between the narrow STI regions. FIG. 14B is a cross-sectional view of the narrow STI region between the active regions of the MOS transistors.

FIGS. 14A and 14B each show a state in which the uniform SiO2 layers 70 and the uniform SiN layers 71 are alternately deposited, each of the SiO2 layer 70 and the SiN layer 71 having a thickness smaller than the width of the STI region, thereby filling the STI region with the stressors formed of the SiO2 layers 70 and the SiN layers 71.

For example, the thickness of the SiO2 layer 70 is set at about 30 nm. The thickness of the SiN layer 71 is set at about 20 nm. In this case, the ratio of the thickness of the SiO2 layer 70 to the thickness of the SiN layer 71 is 6:4.

FIGS. 14C and 14D are cross-sectional views of the wide STI region and the active region of the MOS transistor. FIG. 14C is a cross-sectional view of the active region of the MOS transistor between the wide STI regions. FIG. 14D is a cross-sectional view of the wide STI region between the active regions of the MOS transistors.

FIGS. 14C and 14D each show a state in which the uniform SiO2 layers 70 and the uniform SiN layers 71 are alternately deposited, each of the SiO2 layer 70 and the SiN layer 71 having a thickness smaller than the width of the STI region, thereby filling the STI region with the stressors formed of the SiO2 layers 70 and the SiN layers 71. In the case where the ratio of the thickness of the thin, uniform SiO2 layer 70 to the thickness of the SiN layer 71 is 6:4, the ratio of the thickness of the SiO2 layer 70 to the thickness of the SiN layer 71 arranged in the region is also 6:4.

According to FIGS. 14A to 14D, in the case where the thin, uniform SiO2 layers 70 and the thin, uniform SiN layers 71 are alternately deposited to fill the STI region with the stressors formed of the SiO2 layers 70 and the SiN layers 71, the ratio of the width of the SiO2 layer 70 to the width of the SiN layer 71 in the trench can be fixed regardless of the width of the STI region. Thus, even when the narrow STI region shown in FIGS. 14A and 14B and the wide STI region shown in FIGS. 14C and 14D are present in the same semiconductor device, the ratio of the SiO2 layer 70 to the SiN layer 71 arranged in the STI region can be fixed.

According to the method for manufacturing a semiconductor device according to the fifth embodiment, the method for manufacturing the semiconductor device having the STI regions with different widths includes a step of alternately stacking a plurality of uniform stressor layers at a predetermined thickness ratio, the stressor layers each having a thickness sufficiently smaller than the widths of the STI regions. According to the method for manufacturing the semiconductor device according to the fifth embodiment, advantageously, the ratio of the thicknesses of the stressors arranged in the wide STI region is equal to the ratio of the thicknesses of the stressors arranged in the narrow STI region. Thus, appropriately combining a material having a thermal expansion coefficient larger than that of the silicon crystal and a material having a thermal expansion coefficient smaller than that of the silicon crystal, the strain values in the active regions of almost all MOS transistors included in the semiconductor device according to the fifth embodiment can be adjusted to be constant, thereby advantageously suppressing nonuniformity in the properties of the MOS transistors.

In any case where the MOS transistor included in the semiconductor device according to the fifth embodiment is a P-type MOS transistor or an N-type MOS transistor, when the ratio of the width of the SiO2 layer 70 in the trench to the width of the SiN layer 71 in the trench is 6:4, as shown in FIG. 2C, nonuniformity in the properties of the MOS transistors can be understandably suppressed.

In the description of the fifth embodiment, the SiO2 layer 70 and the SiN layer 71 are used. Also in the case where a SiOC layer, a SiC layer, a SiCN layer, or the like is used in place of the SiN layer 71, the same effect is naturally exerted because each of the SiOC layer, the SiC layer, and the SiCN layer has a thermal expansion coefficient larger than that of the silicon crystal and produces a tensile strain as in the SiN layer 71.

Sixth Embodiment

A sixth embodiment relates to a semiconductor device, in which strain in an active region of a MOS transistor is adjusted by various combinations of materials (hereinafter, referred to as "stressors" in the sixth embodiment) that produce strain, e.g., a SiO2 layer and a SiN layer. Examples of the combinations of the stressor materials used for the semiconductor device according to the sixth embodiment will be described with reference to FIGS. 15A to 15C.

FIGS. 15A to 15C show active regions of MOS transistors and STI regions that isolate the active regions of the semiconductor device according to the sixth embodiment. FIGS. 15A to 15C show SiO2 layers 75, SiN layers 76, active regions 77, source subregions 78 of the MOS transistors, drain subregions 79 of the MOS transistors, gate electrodes 80 of the MOS transistors, and thermal oxide SiO2 (81).

FIG. 15A shows the active region 77 of the MOS transistor and the STI region according to the sixth embodiment. In particular, FIG. 15A shows an example of a structure in which the width of the STI region parallel to the direction in which the source subregion 78 and the drain subregion 79 of the MOS transistor are connected is different from the width of the STI region parallel to the longitudinal direction of the gate electrode.

The following steps of filling the STI region with the SiO2 layer 75 and the SiN layer 76 are performed. A groove for isolating the MOS transistor is formed. The SiN layer 76 having a uniform thickness is deposited in such a manner that the STI region is partially filled with the SiN layer 76. Then the SiO2 layer 75 having a uniform thickness is deposited in such a manner that the remaining portion of the STI region is completely filled with the SiO2 layer 75. The SiO2 layer 75 and the SiN layer 76 located outside the STI region are removed by CMP to fill the STI region with the SiO2 layer 75 and the SiN layer 76.

According to the semiconductor device shown in FIG. 15A, the STI region shown in FIG. 15A has different widths in response to directions. Thus, a blank portion in the STI region after the deposition of the SiN layer 76 has different widths. Therefore, the STI region has a structure in which the ratio of the thickness of the SiO2 layer 75 to the thickness of the SiN layer 76 varies in response to the directions. As shown in FIG. 2C, although the ratio of the thickness of the SiO2 layer 75 to the thickness of the SiN layer 76 is not 6:4, adjustment can be performed in such a manner that the active region of the MOS transistor has a reduced strain because the STI region is filled with the combination of the SiO2 layer 75 and the SiN layer 76. Accordingly, there is the effect of suppressing nonuniformity in the properties of the MOS transistors.

In any case where the MOS transistor included in the semiconductor device according to the sixth embodiment is a P-type MOS transistor or an N-type MOS transistor, the semiconductor device according to the sixth embodiment has the same effect.

FIG. 15B shows the active region of the MOS transistor and the STI region according to the sixth embodiment. In particular, FIG. 15B shows an example of a structure in which the STI region parallel to the direction in which the source subregion 78 and the drain subregion 79 of the MOS transistor are connected and the STI region parallel to the longitudinal direction of the gate electrode are filled with different combinations of stressors. The width of the STI region parallel to the direction in which the source subregion 78 and the drain subregion 79 of the MOS transistor are connected is narrow.

The width of the STI region parallel to the longitudinal direction of the gate electrode is wide.

The following steps of forming thermal oxide SiO2 (81) and the SiO2 layer 75 and filling the STI region with the SiN layer 76 are performed. A groove for isolating the MOS transistor is formed. Thermal oxidation is performed to form thermal oxide SiO2 (81) around the active region 77 of the MOS transistor. The SiN layer 76 having a uniform thickness is deposited in such a manner that the STI region parallel to the direction in which the source subregion 78 and the drain subregion 79 are connected is filled with the SiN layer 76. A resist pattern is formed by photolithography. Etching is performed with the resist pattern as a mask to remove the SiN layer 76 in the STI region parallel to the longitudinal direction of the gate electrode. After the removal of the resist pattern, the SiO2 layer 75 having a uniform thickness is deposited in such a manner that the STI region parallel to the longitudinal direction of the gate electrode is completely filled with the SiO2 layer 75. The SiO2 layer 75 and the SiN layer 76 located outside the STI region are removed by CMP to fill the STI region with the SiO2 layer 75 and the SiN layer 76.

According to the semiconductor device shown in FIG. 15B, thermal oxide SiO2 (81) for reducing a surface level on the surface of the active region 77 is formed around the active region 77 after the formation of the groove for isolating the active region 77, thus suppressing a change in the properties of the MOS transistor due to the surface level. The stressor material such as SiO2 layer 75 that produces strain in the active region 77 of the MOS transistor is arranged in the STI region. Thus, the strain in the active region 77 of the MOS transistor can be adjusted.

FIG. 15C shows the active region of the MOS transistor and the STI region of the semiconductor device according to the sixth embodiment. The width of the STI region parallel to the direction in which the source subregion 78 and the drain subregion 79 of the MOS transistor are connected is narrow, and the width of the STI region parallel to the longitudinal direction of the gate electrode is wide, as in FIG. 15A. However, another combination of materials is used as described below. Furthermore, another manufacture method is employed.

The following steps of filling the STI region with predetermined materials are performed. A groove for isolating MOS transistors is formed. The SiO2 layer 75 having a uniform thickness is deposited in such a manner that the STI region parallel to the direction in which the source subregion 78 and the drain subregion 79 are connected is filled with the SiO2 layer 75 but that the STI region parallel to the longitudinal direction of the gate electrode is partially filled with the SiO2 layer 75. Then the SiN layer 76 having a uniform thickness is deposited in such a manner that the remaining portion of the STI region parallel to the longitudinal direction of the gate electrode is not completely filled with the SiN layer 76. The SiO2 layer 75 having a uniform thickness is deposited again in such a manner that the STI region parallel to the longitudinal direction of the gate electrode is completely filled with the SiO2 layer 75. The SiO2 layer 75 and the SiN layer 76 located outside the STI region are removed by CMP to fill the STI region with the SiO2 layer 75 and the SiN layer 76. The STI region parallel to the direction in which the source subregion 78 and the drain subregion 79 are connected is filled with the SiO2 layer 75 alone. In the STI region parallel to the longitudinal direction of the gate electrode, the SiO2 layers 75 are arranged in the center portion and a portion near the active region of the MOS transistor, and the SiN layer 76 is arranged in the intermediate portion interposed between the SiO2 layers 75.

According to the semiconductor device shown in FIG. 15C, a compressive strain is produced in the active region of the MOS transistor from the longitudinal direction of the gate electrode. A force from the combined materials of the SiO2 layer 75 and the SiN layer 76 is applied to the active region of the MOS transistor from the direction in which the source subregion 78 and the drain subregion 79 are connected. That is, the strain in the active region in the direction in which the source subregion 78 and the drain subregion 79 are connected is adjusted by the combination of the stressors such as the SiO2 layer 75, thereby suppressing a change in the properties of the MOS transistor due to stress.

Seventh Embodiment

A seventh embodiment relates to a semiconductor device including a plurality of P-type MOS transistors or N-type MOS transistors, in which strain in active regions of the MOS transistors is adjusted by the arrangement of the MOS transistors including materials (hereinafter, referred to as "stressors" in the seventh embodiment), such as a SiO2 layer and a SiN layer, which produce strain in STI regions that isolate the active regions of the MOS transistors as shown in FIG. 6A or 6B. Examples of the arrangement of the stressor materials used in the semiconductor device according to the seventh embodiment will be described with reference to FIGS. 16, 17, and 18.

Figure 16:
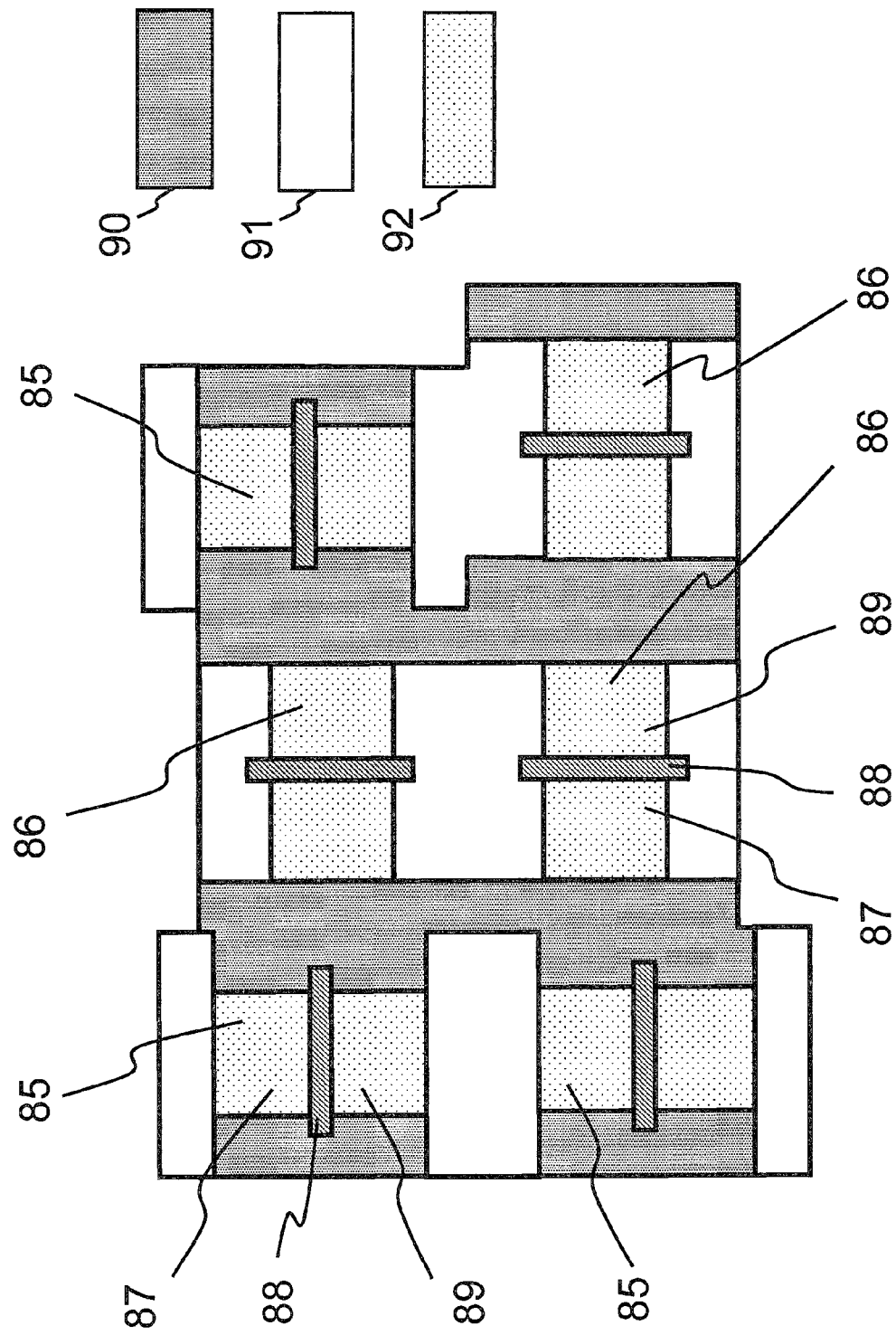
FIG. 16 shows a semiconductor device including P-type MOS transistors, N-type MOS transistors, and STI regions according to a seventh embodiment.

FIG. 16 shows a semiconductor device including a plurality of P-type MOS transistors, a plurality of N-type MOS transistors, and STI regions. FIG. 16 shows N-type MOS transistors 85, P-type MOS transistors 86, source subregions 87, gate electrodes 88, drain subregions 89, SiO2 layers 90, SiN layers 91, and active regions 92.

In FIG. 16, each of the N-type MOS transistors 85 and each of the P-type MOS transistor 86 are arranged in such a manner that the direction in which the source subregion 87 and the drain subregion 89 of the N-type MOS transistor are connected is orthogonal to the direction in which the source subregion 87 and the drain subregion 89 of the P-type MOS transistor. The SiO2 layer 90 and the SiN layer 91 are arranged in the STI region around the active region 92 of each N-type MOS transistor 85, as shown in FIG. 6A. The SiO2 layer 90 and the SiN layer 91 are arranged in the STI region around the active region 92 of each P-type MOS transistor 86, as shown in FIG. 6B. In the case where attention is focused on the active region 92 of one MOS transistor, the MOS transistor is arranged in such a manner that when the active region 92 is extended in the direction in which the source subregion 87 and the drain subregion 89 are connected, the extension intersects with the active region 92 of adjacent MOS transistor.

In the case of the arrangement of the P-type MOS transistors and the N-type MOS transistors as described above, the stressors producing the same type of strain can be commonly used between the active regions 92 of adjacent MOS transistors. Thus, the strain in the active region 92 of the MOS transistor on which attention is focused can be maintained as shown in FIG. 7A.

The semiconductor device shown in FIG. 16 includes the active regions 92 of the P-type MOS transistors 86, the active regions 92 of the N-type MOS transistors 85, and grooves surrounding each of the active region 92. The grooves are filled with combined stressors, as shown in FIGS. 6A and 6B.

According to the semiconductor device shown in FIG. 16, the P-type MOS transistors 86 and the N-type MOS transistors 85 can be advantageously arranged without a gap while the relationship between the MOS transistor and the stressor materials arranged in the STI region is maintained as shown in FIGS. 6A and 6B. In other words, the MOS transistors can be advantageously arranged in such a manner that the strain in the active regions 92 of the MOS transistors is maintained.

Figure 17:
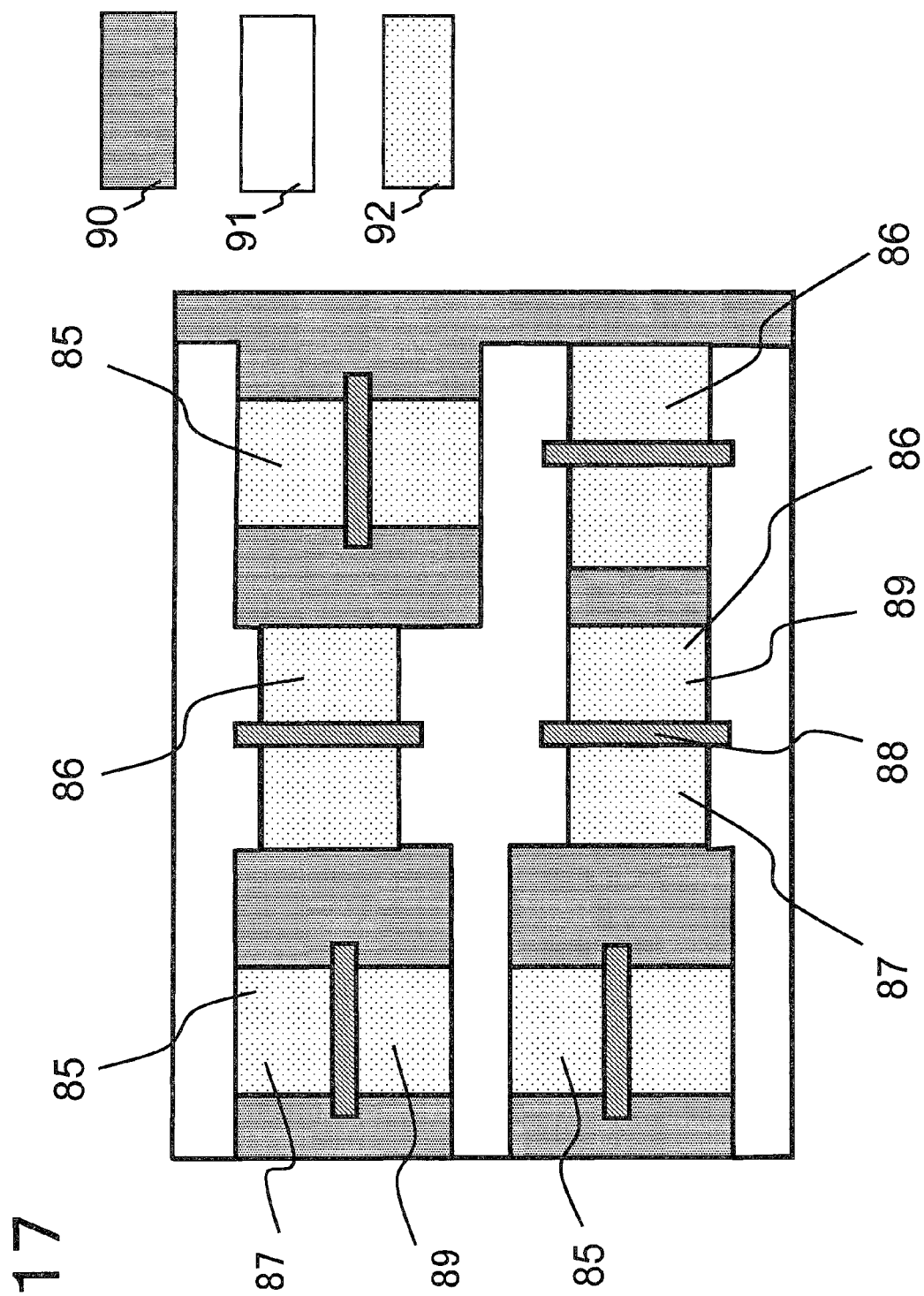
FIG. 17 shows a semiconductor device including P-type MOS transistors, N-type MOS transistors, and STI regions.

FIG. 17 shows a semiconductor device including the plurality of P-type MOS transistors 86, the plurality of N-type MOS transistors 85, and STI regions. FIG. 17 shows the N-type MOS transistors 85, the P-type MOS transistors 86, the source subregions 87, the gate electrodes 88, the drain subregions 89, the SiO2 layers 90, the SiN layers 91, and the active regions 92. The same elements as those in FIG. 16 are designated using the same reference numerals.

The arrangement of the P-type MOS transistors 86 and the N-type MOS transistors 85 shown in FIG. 17 is the same as in FIG. 16. The arrangement of the stressor materials such as the SiO2 layer 90 and the SiN layer 91 arranged in the STI regions shown in FIG. 17 is also the same as in FIG. 16. In each of the MOS transistors, however, the fact that the total height of the active region 92 of the MOS transistor and the STI region is substantially the same as the total width thereof is different.

The semiconductor device shown in FIG. 17 includes the active regions 92 of the P-type MOS transistors 86, the active regions 92 of the N-type MOS transistors 85, and grooves surrounding each of the active region 92. The grooves are filled with combined stressors, as shown in FIGS. 6A and 6B.

The semiconductor device shown in FIG. 17 provides the same effect as that of the semiconductor device shown in FIG. 16. In each of the MOS transistors shown in FIG. 17, the total height of the active region 92 of the MOS transistor and the STI region is substantially the same as the total width thereof. This eliminates the arrangement of an extra STI region when the MOS transistors are arrayed in a matrix, thereby advantageously reducing the area where the MOS transistors are arranged.

Figure 18:
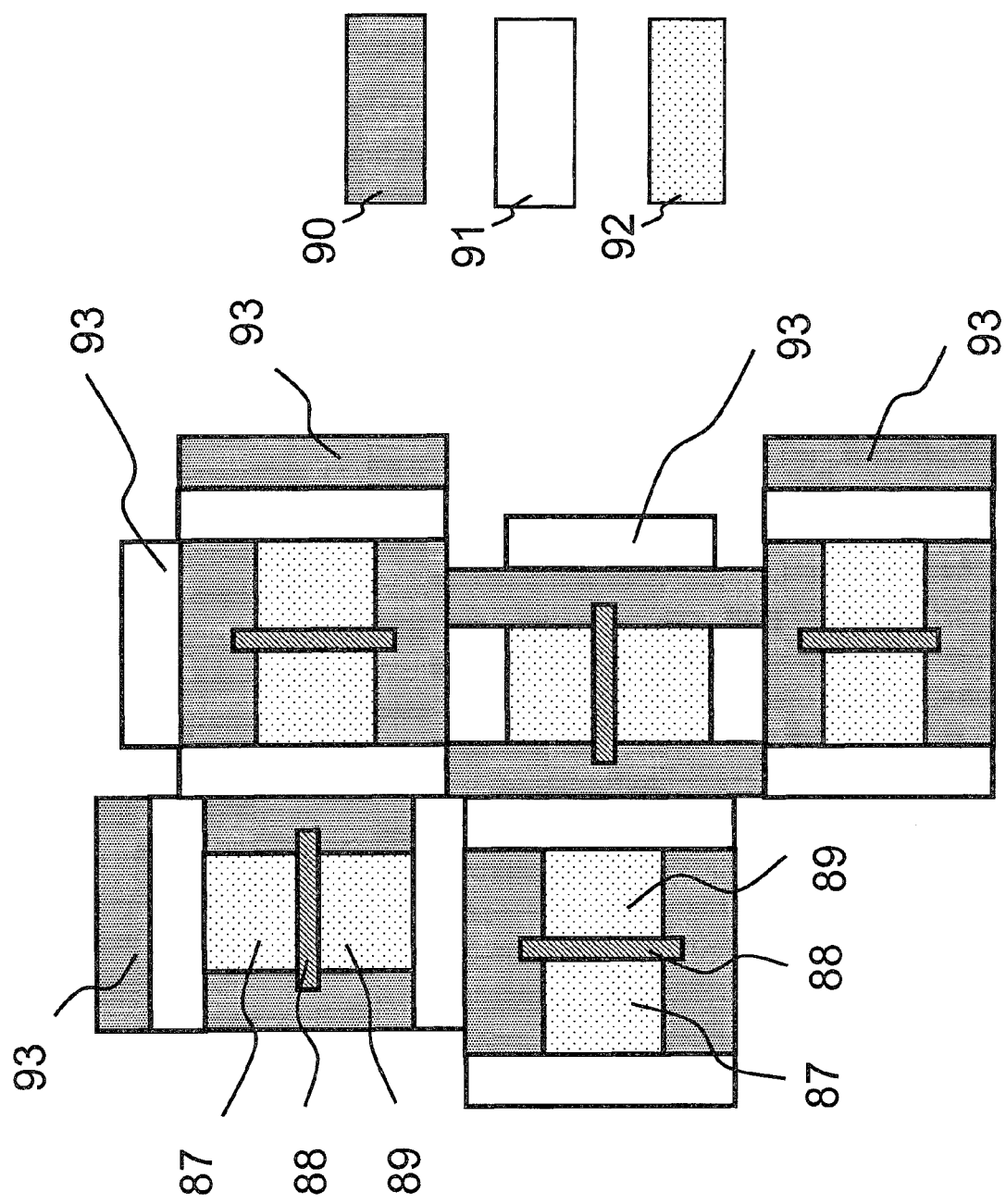
FIG. 18 shows a semiconductor device including N-type MOS transistors 85 and STI regions.

FIG. 18 shows a semiconductor device including the plurality of N-type MOS transistors 85 and STI regions. FIG. 18 shows the N-type MOS transistors 85, the source subregions 87, the gate electrodes 88, the drain subregions 89, the SiO2 layers 90, the SiN layers 91, the active regions 92, dummy STI regions 93. The same elements as those in FIG. 16 are designated using the same reference numerals.

As shown in FIG. 18, in a MOS-transistor block in which only the N-type MOS transistors 85 are arranged, the MOS transistors are arranged in such a manner that the direction in which the source subregion 87 and the drain subregion 89 of the N-type MOS transistor 85 are connected is orthogonal to the direction in which the source subregion 87 and the drain-subregion 89 of adjacent N-type MOS transistor 85. The SiO2 layer 90 and the SiN layer 91 are arranged in the STI region around the active region 92 of each N-type MOS transistor 85, as shown in FIG. 6A. The dummy STI regions 93 are arranged outside the MOS-transistor block.

In the case where attention is focused on the active region 92 of one MOS transistor, the MOS transistor is arranged in such a manner that when the active region 92 is extended in the direction in which the source subregion 87 and the drain subregion 89 are connected, the extension intersects with the active region 92 of adjacent MOS transistor.

In the arrangement described above, the stressor arranged on a side of the active region 92 of the MOS transistor on which attention is focused lies adjacent to a side of the active region 92 of adjacent MOS transistor. Thus, the strain in the active region 92 of the MOS transistor on which attention is focused in FIG. 18 can be relieved with respect to the strain in the active region of the MOS transistor shown in FIG. 6A. To relieve the strain in the active regions 92 of the MOS transistors located ends of the block, the dummy STI regions 93 are arranged outside the MOS-transistor block. Since the effect of relieving the strain is provided by the combination of the MOS transistors, the effect is not provided at the ends of the block.

According to the semiconductor devices shown in FIGS. 16 to 18, in the case where the MOS transistors including the stressors arranged to increase the strain in the active regions 92 of the MOS transistors, i.e., the MOS transistors shown in FIG. 6A or 6B, are arranged in such a manner that each of the N-type MOS transistors 85 is orthogonal to a corresponding one of the P-type MOS transistors 86, the strain in the active regions 92 of the MOS transistors is maintained. In the case where the MOS transistors are arranged in such a manner that only the N-type MOS transistors 85 or only the P-type MOS transistors 86 are orthogonal to each other, the strain in the active regions 92 of the MOS transistors is relieved.

Eighth Embodiment

An eighth embodiment relates to a semiconductor device including a plurality of predetermined areas having controlled strain, in which an STI region filled with materials (hereinafter, referred to as "stressors" in the eighth embodiment) that produce strain is arranged around the predetermined areas. The eighth embodiment will be described with reference to FIG. 19.

Figure 19:
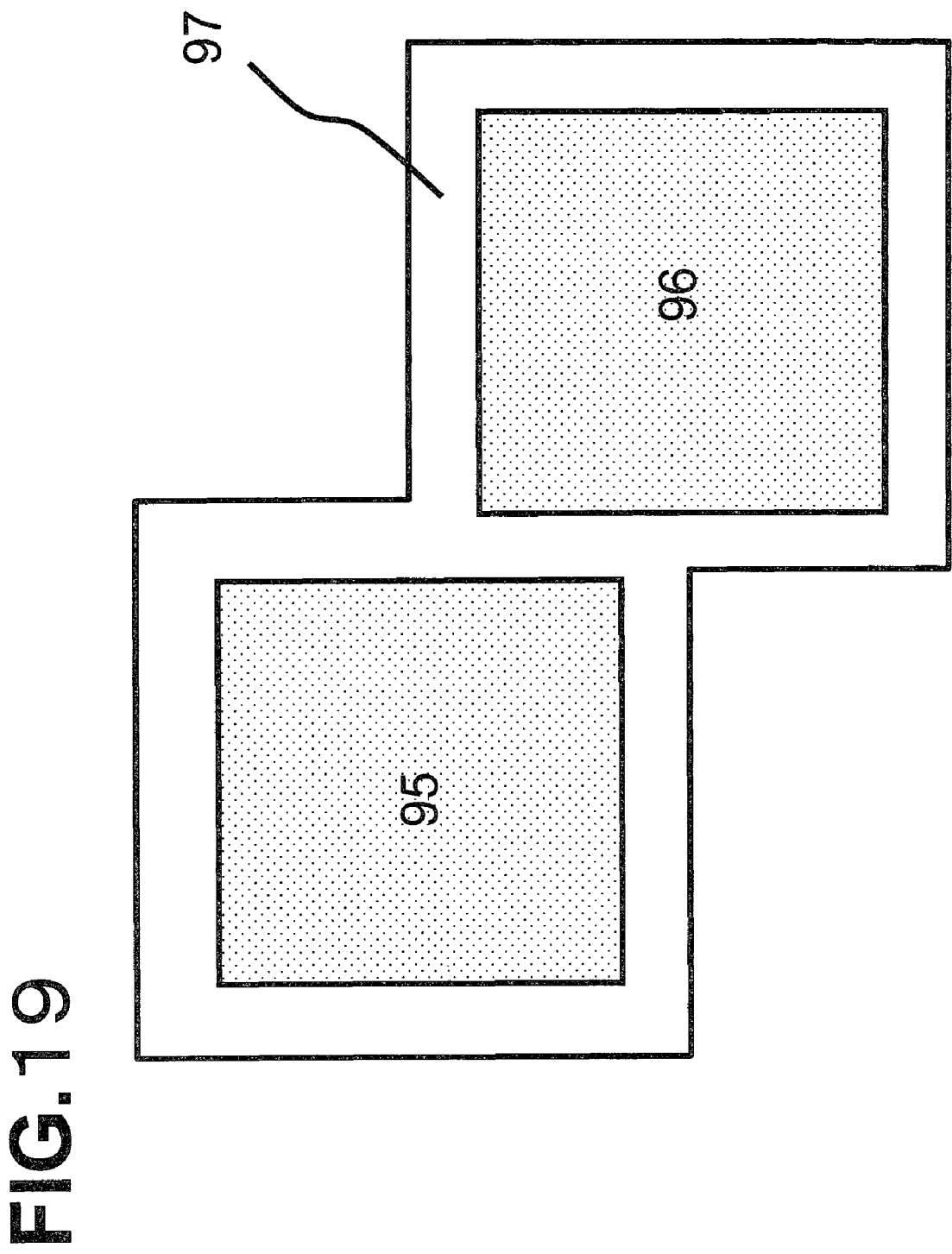
FIG. 19 shows a semiconductor device according to an eighth embodiment.

FIG. 19 shows the semiconductor device according to the eighth embodiment. FIG. 19 shows a predetermined area A 95, a predetermined area B 96, and an STI region 97.

The area A 95 and the area B 96 represent circuits in which transistors are integrated. The STI region is arranged around the area A 95 and the area B 96 so as to surround each of the areas. Elements with properties that vary similarly when the same type of strain is applied to the elements are arranged in the area A 95 and the area B 96. For example, active elements with properties that vary in response to strain may be arranged in one area, e.g., an area where the majority of transistors are P-type MOS transistors or an area where the majority of transistors are N-type MOS transistors.

The STI region 97 is filled with a combination of the stressor materials in order to adjust strain that induces or suppresses the change in the properties of the elements in the area A 95 and the area B 96.

The semiconductor device according to the eighth embodiment has the effect of applying the same type of strain to the entire area including the plurality of elements. The semiconductor device can produce the same change in the properties of the plurality of elements.

In the case where the above-described area and the STI region that produces a predetermined strain in each of the areas are defined as a block area, the state of strain can be further adjusted by the arrangement of a combination of the block areas. This is attributed to the same effect as the fact that in the seventh embodiment, the MOS transistors and the STI regions around the MOS transistors are defined as the MOS-transistor block and that the strain in the active region of each of the MOS transistors is adjusted by the arrangement of the MOS-transistor block.

Ninth Embodiment

A ninth embodiment relates to a semiconductor device including STI regions and a plurality of N-type MOS transistors or a plurality of P-type MOS transistors, in which in order to adjust strain, the STI regions are each filled with a combination of materials (hereinafter, referred to as "stressors" in the ninth embodiment) that produce strain, and the combination is not described in other embodiments. The ninth embodiment will be described with reference to FIGS. 20 and 21.

Figure 20:
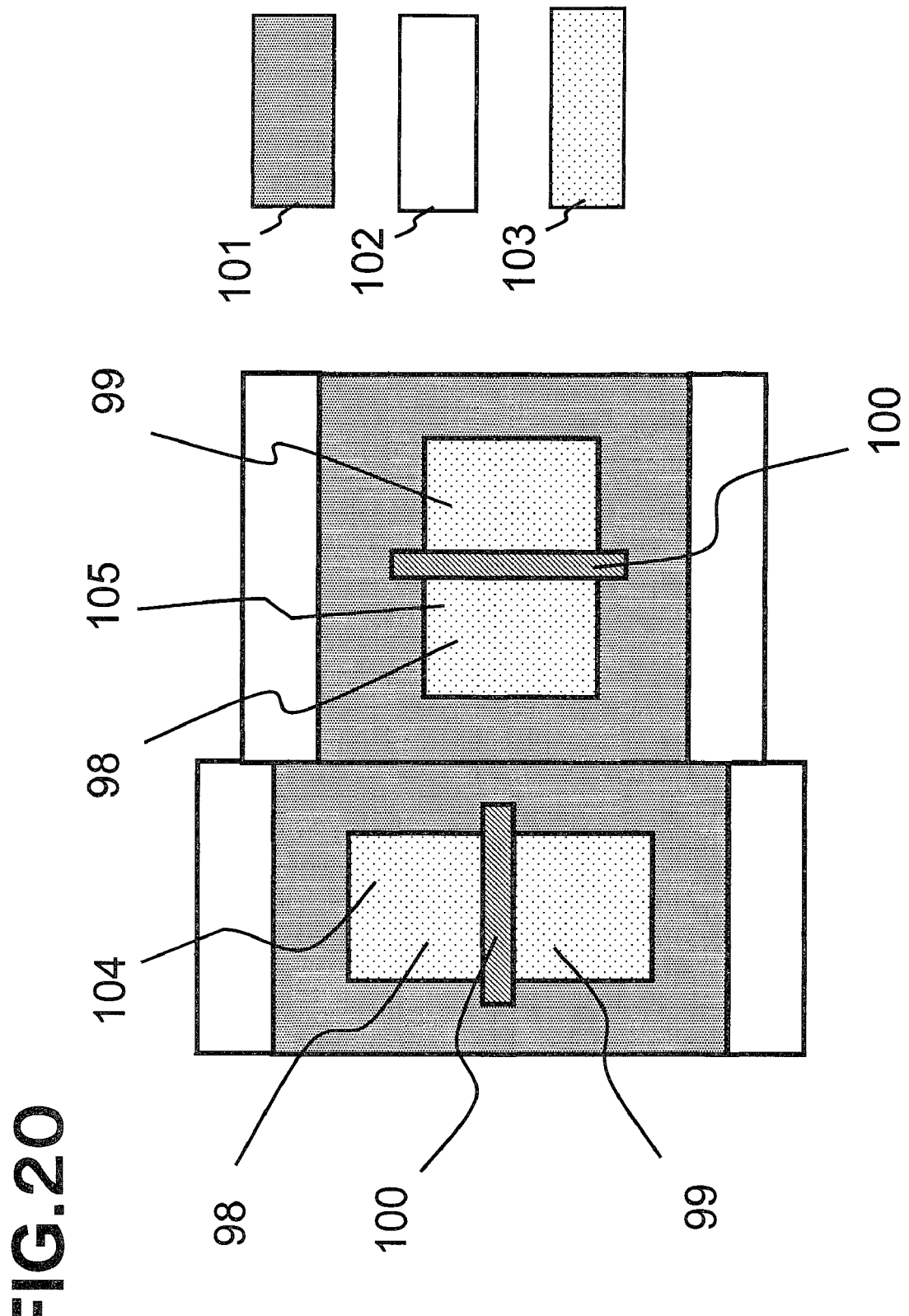
FIG. 20 shows a semiconductor device including a P-type MOS transistor, an N-type MOS transistor, and STI regions arranged around these MOS transistors according to ninth embodiment.

FIG. 20 shows a semiconductor device including a P-type MOS transistor, an N-type MOS transistor, and STI regions arranged around these MOS transistors. FIG. 20 shows source subregions 98 of the MOS transistors, drain subregions 99 of the MOS transistors, gate electrodes 100 of the MOS transistors, SiO2 layers 101, SiN layers 102, active regions 103 of the MOS transistors, an N-type MOS transistor 104, and a P-type MOS transistor 105.

In FIG. 20, in the N-type MOS transistor 104, portions of the STI region perpendicular to the longitudinal direction of the gate electrode 100 of the N-type MOS transistor 104 are filled with only the SiO2 layers 101. Portions perpendicular to the direction in which the source subregion 98 and the drain subregion 99 of the N-type MOS transistor 104 are connected are filled with the SiO2 layers 101 and the SiN layers 102. In the STI region of the N-type MOS transistor 104, the SiO2 layers 101 are arranged adjacent to the active region 103, and the SiN layers 102 are arranged adjacent to the SiO2 layers 101.

Portions parallel to the longitudinal direction of the gate electrode 100 of the P-type MOS transistor 105 are filled with only the SiO2 layers 101. Portions parallel to the direction in which the source subregion 98 and the drain subregion 99 of the P-type MOS transistor 105 are connected are filled with the SiO2 layers 101 and the SiN layers 102. In the STI region of the P-type MOS transistor 105, the SiO2 layers 101 are arranged adjacent to the active region 103, and the SiN layers 102 are arranged adjacent to the SiO2 layers 101. In other words, each of the SiO2 layers 101 is arranged so as to surround a corresponding one of the active regions 103 of the MOS transistors. Each of the SiN layers 102 is arranged so as to be adjacent to a side in the longitudinal direction or a side in the transverse direction. Whether each SiN layer 102 is arranged adjacent to the side in the longitudinal direction or in the transverse direction depends on whether the properties of the MOS transistor are improved or not.

In FIG. 20, the N-type MOS transistor 104 and the P-type MOS transistor 105 are arranged in such a manner that the direction in which the source subregion 98 and the drain subregion 99 of the N-type MOS transistor 104 are connected is orthogonal to the direction in which the source subregion 98 and the drain subregion 99 of P-type MOS transistor 105 are connected. Thus, the SiO2 layers 101 arranged in the STI regions of the MOS transistors are arranged adjacent to each other.

The semiconductor device shown in FIG. 20 includes the active region 103 of the P-type MOS transistor 105, the active region 103 of the N-type MOS transistor 104, and grooves surrounding the active regions 103. The grooves are filled with combined stressors, as shown in FIGS. 13A and 13B.

According to the semiconductor device shown in FIG. 20, each of the SiO2 layers 101 is arranged in the form of a ring, whereas each of the SiN layers 102 is arranged so as to be adjacent to a side in the longitudinal direction or a side in the transverse direction. Thus, the properties of both the N-type MOS transistor 104 and the P-type MOS transistor 105 are improved. The SiO2 layers 101 each arranged so as to surround a corresponding one of the active regions 103 are formed by forming the grooves in one operation and then depositing the uniform SiO2 layers 101, thereby simplifying the manufacturing process.

Figure 21:
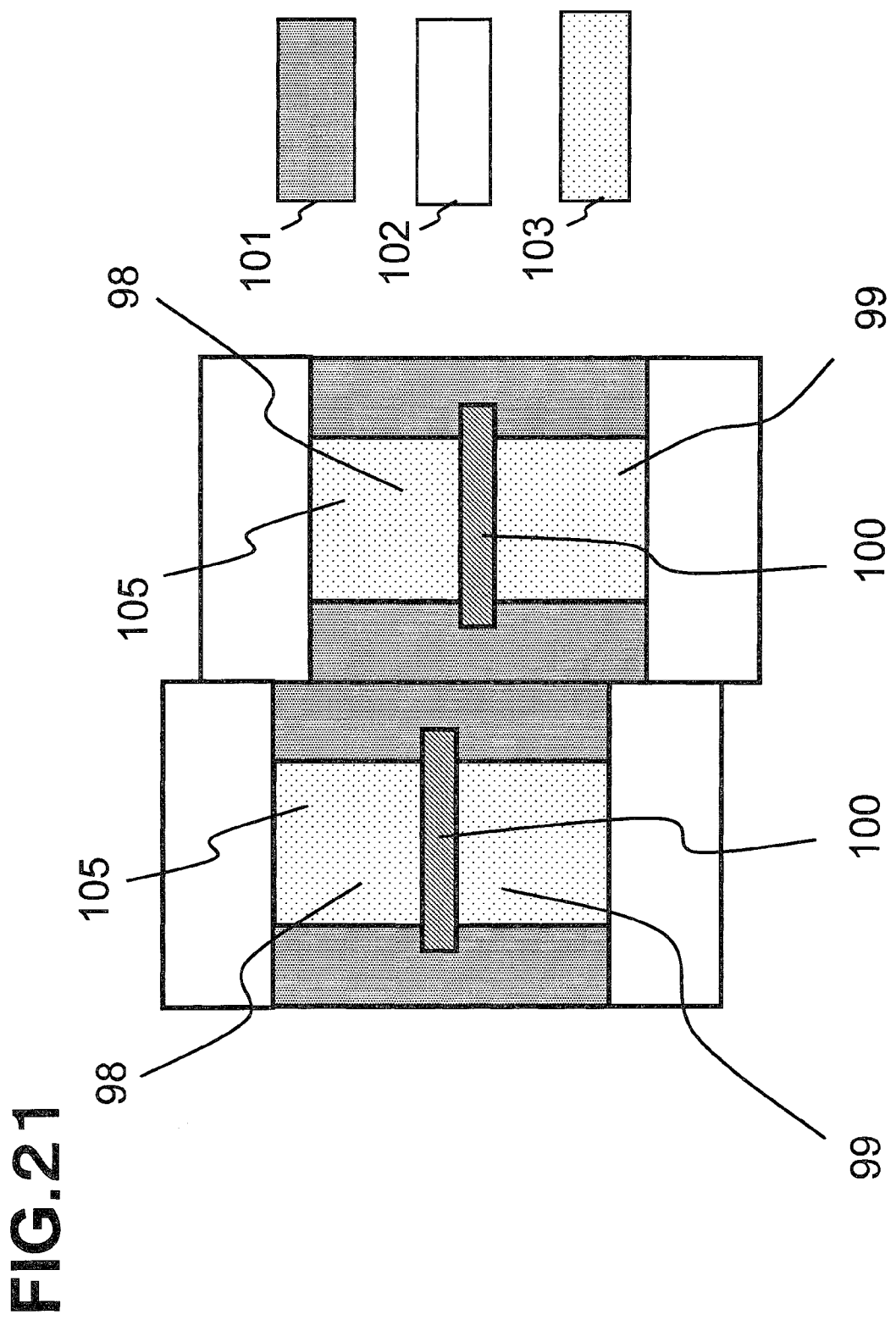
FIG. 21 shows a semiconductor device including a plurality of MOS transistors and STI regions arranged around these MOS transistors.

FIG. 21 shows a semiconductor device including a plurality of MOS transistors and STI regions around the MOS transistors. FIG. 21 shows the source subregions 98 of the MOS transistors, the drain subregions 99 of the MOS transistors, the gate electrode 100 of the MOS transistors, the SiO2 layers 101, the SiN layers 102, the active regions 103 of the MOS transistors, and the P-type MOS transistors 105. The same elements as those in FIG. 20 are designated using the same reference numerals.

In FIG. 21, in the STI regions of the P-type MOS transistors 105, portions parallel to the longitudinal direction of the gate electrode 100 of the P-type MOS transistor 105 are filled with only the SiN layers 102. Portions parallel to the direction in which the source subregion 98 and the drain subregion 99 of the P-type MOS transistor 105 are connected are filled with only the SiO2 layers 101.

In FIG. 21, the P-type MOS transistors 105 are arranged in such a manner that the SiO2 layers 101 in the STI regions are adjacent to each other.

The semiconductor device shown in FIG. 21 includes the active regions 103 of P-type MOS transistors 105 and grooves surrounding the active regions 103. The grooves are filled with combined stressors, as shown in FIG. 6B.

In each of the P-type MOS transistors 105 of the semiconductor device shown in FIG. 21, the STI region is filled with the same combined stressors as in FIG. 6B. Two P-type MOS transistors 105 are arranged in such a manner that the SiO2 layers 101 in the STI regions are adjacent to each other. Thus, the properties of the two P-type MOS transistors 105 are not degraded because of the parallel arrangement.

In the semiconductor device according to the ninth embodiment, as described above, the plurality of MOS transistors and the stressor materials that determine the state of strain in the active regions of the MOS transistors are arranged adjacent to each other in the direction such that the state of the strain in the active regions of the MOS transistors is maintained. Thus, the plurality of MOS transistors have improved properties. Therefore, the semiconductor device including the MOS transistors has improved performance.

What is claimed is:

1. A semiconductor device comprising:
a semiconductor substrate;
an active region arranged in the semiconductor substrate; and
a groove surrounding the periphery of the active region, wherein the groove is filled with a combination of a first material that produces a tensile strain in the active region and a second material that produces a compressive strain in the active region, the composition of the first material and the second material in the combination of the first material and the second material being determined in accordance with a shape of the active region so as to generate a predetermined sum of the tensile strain and the compressive strain.

2. The semiconductor device according to claim 1, wherein the first material or the second material is arranged in a circular region surrounding the periphery of the active region, the circular region being in the groove, the circular region being bordered on the side wall of the active region, a width of the circular region is less than half of a width of the groove.

3. The semiconductor device according to claim 2, wherein when the first material is silicon nitride and the second material is silicon oxide,
the ratio of the width of the first material to the width of the second material with which the groove is filled is 6:4.

4. The semiconductor device according to claim 1, wherein the first material or the second material is arranged in a block region, the block region being in the groove.

5. The semiconductor device according to claim 4, wherein the block region including either the first material or the second material and the circular region including either the first material or the second material and surrounding the periphery of the active region are arranged in the groove, so that the combination of the first material and the second material is achieved.

6. The semiconductor device according to claim 5, wherein the widths and arrangement of the block region and the circular region are adjusted in response to a strain in the active region of a MOS transistor.

7. The semiconductor device according to claim 6, wherein the first material is an insulating material having an expansion coefficient smaller than that of a material constituting the active region, and the second material is an insulating material having an expansion coefficient larger than that of the material constituting the active region.

8. The semiconductor device according to claim 7, wherein a material constituting the active region is a silicon crystal, and the first material is silicon nitride, silicon oxynitride, silicon oxycarbide, silicon carbide, silicon oxycarbonitride, an organic insulating material having a low dielectric constant, or an inorganic insulating material having a low dielectric constant.

9. The semiconductor device according to claim 7, wherein a material constituting the active region is a silicon crystal, and the second material is silicon oxide.

10. The semiconductor device according to claim 4, wherein the region composed of the first material is in the groove parallel to the direction in which a source subregion and a drain subregion of a P-type MOS transistor are connected, and is adjacent to the active region of the P-type MOS transistor at a portion directly under a gate electrode of the P-type MOS transistor, and wherein the region composed of the second material is in the groove parallel to the direction in which a source subregion and a drain subregion of an N-type MOS transistor are connected, and is adjacent to the active region of the N-type MOS transistor at a portion directly under a gate electrode of the N-type MOS transistor.

* * * * *